United States Patent
Chen et al.

(10) Patent No.: US 10,535,635 B2
(45) Date of Patent: Jan. 14, 2020

(54) SECOND SEMICONDUCTOR WAFER ATTACHED TO A FIRST SEMICONDUCTOR WAFER WITH A THROUGH HOLE CONNECTED TO AN INDUCTOR

(71) Applicant: TAIWAN SEMICONDUCTOR MANUFACTURING COMPANY, LTD., Hsinchu (TW)

(72) Inventors: Chih-Lin Chen, Hsinchu (TW); Chin-Chou Liu, Jhubei (TW); Fong-Yuan Chang, Hsinchu (TW); Hui-Yu Lee, Hsinchu (TW); Po-Hsiang Huang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/009,579

(22) Filed: Jun. 15, 2018

(65) Prior Publication Data
US 2019/0385980 A1    Dec. 19, 2019

(51) Int. Cl.
*H01L 23/12*    (2006.01)
*H01L 23/34*    (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC ........... H01L 25/0657; H01L 21/76898; H01L 23/481; H01L 23/5227; H01L 24/32;
(Continued)

(56) References Cited

U.S. PATENT DOCUMENTS

2010/0140779 A1* 6/2010 Lin .................. H01L 23/49816
257/690
2012/0038053 A1* 2/2012 Oh ........................ H01L 21/561
257/773
(Continued)

FOREIGN PATENT DOCUMENTS

| TW | 201330228 | 7/2013 |
| TW | 201405775 | 2/2014 |
| TW | 201721807 | 6/2017 |

OTHER PUBLICATIONS

Office Action dated Apr. 15, 2019 from corresponding application No. TW 107129274.

*Primary Examiner* — Alonzo Chambliss
(74) *Attorney, Agent, or Firm* — Hauptman Ham, LLP

(57) ABSTRACT

An integrated circuit includes a first semiconductor wafer, a second semiconductor wafer, a first interconnect structure, an inductor, a second interconnect structure and a through substrate via. The first semiconductor wafer has a first device in a front side of the first semiconductor wafer. The second semiconductor wafer is bonded to the first semiconductor wafer. The first interconnect structure is below a backside of the first semiconductor wafer. The inductor is below the first semiconductor wafer, and at least a portion of the inductor is within the first interconnect structure. The second interconnect structure is on the front side of the first semiconductor wafer. The through substrate via extends through the first semiconductor wafer. The inductor is coupled to at least the first device by the second interconnect structure and the through substrate via.

20 Claims, 14 Drawing Sheets

(51) Int. Cl.
*H01L 21/00* (2006.01)
*H01L 25/065* (2006.01)
*H01L 49/02* (2006.01)
*H01L 23/48* (2006.01)
*H01L 23/522* (2006.01)
*H01L 23/00* (2006.01)
*H01L 21/768* (2006.01)
*H01L 25/00* (2006.01)
*H01L 23/538* (2006.01)
*H01L 23/528* (2006.01)

(52) U.S. Cl.
CPC ........ *H01L 23/528* (2013.01); *H01L 23/5227* (2013.01); *H01L 23/5389* (2013.01); *H01L 24/32* (2013.01); *H01L 24/83* (2013.01); *H01L 25/50* (2013.01); *H01L 28/10* (2013.01); *H01L 2224/08145* (2013.01); *H01L 2224/83896* (2013.01); *H01L 2225/06524* (2013.01); *H01L 2225/06531* (2013.01); *H01L 2225/06541* (2013.01); *H01L 2924/19042* (2013.01)

(58) Field of Classification Search
CPC ..... H01L 24/83; H01L 25/50; H01L 23/5389; H01L 28/10; H01L 23/528
See application file for complete search history.

(56) References Cited

U.S. PATENT DOCUMENTS

2015/0069570 A1\* 3/2015 Shih .................. H01L 21/76805
257/508
2015/0076710 A1\* 3/2015 Chang .................. H01L 23/481
257/774

\* cited by examiner

SECOND SEMICONDUCTOR WAFER ATTACHED TO A FIRST SEMICONDUCTOR WAFER WITH A THROUGH HOLE CONNECTED TO AN INDUCTOR

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1A:
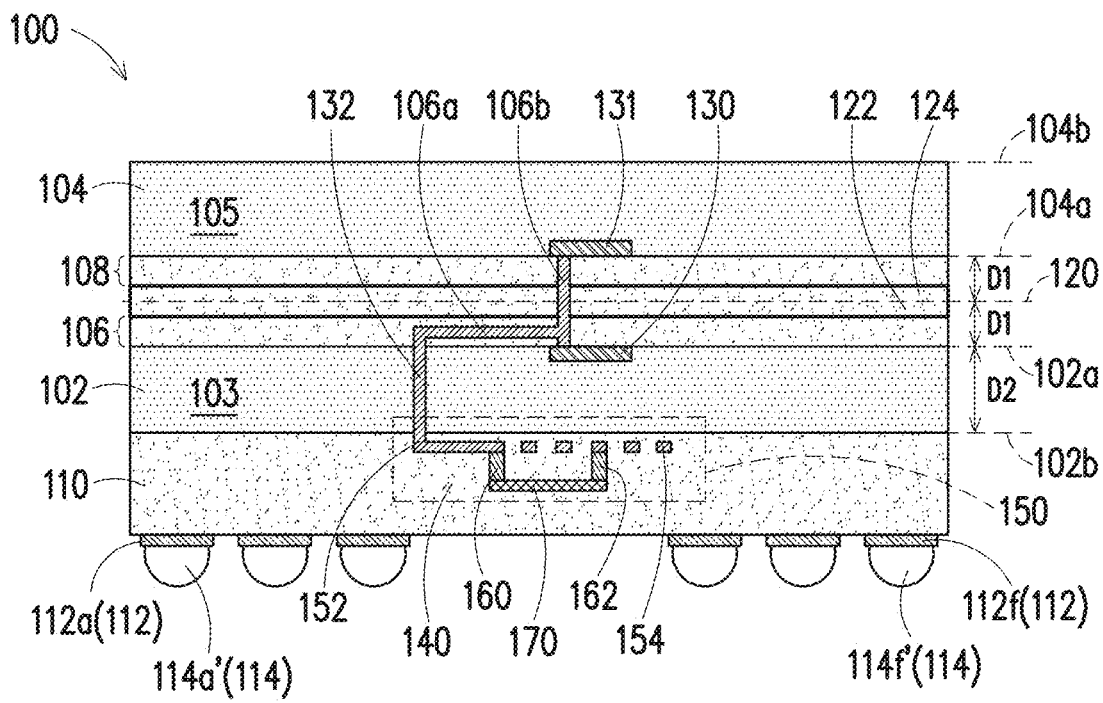
FIG. 1A is a cross-sectional view of an integrated circuit, in accordance with some embodiments.

The patent or application file contains drawings/photographs executed in color. Copies of this patent with color drawing(s)/photograph(s) will be provided by the Office upon request and payment of the necessary fee.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first semiconductor wafer, a second semiconductor wafer, a first interconnect structure, an inductor and a through substrate via.

The first semiconductor wafer has a first device in a front side of the first semiconductor wafer. The second semiconductor wafer is bonded to the first semiconductor wafer. The first interconnect structure is below a backside of the first semiconductor wafer. The inductor is below the first semiconductor wafer, and at least a portion of the inductor is within the first interconnect structure. The through substrate via extends through the first semiconductor wafer, and couples the inductor to at least the first device.

In some embodiments, the inductor is located below the first or second device. In some embodiments, the inductor is separated from the first or second device by a first distance. In some embodiments, the first distance ranges from about 10 μm to about 200 μm. In some instances, if the inductor is separated from the first or second device by a distance greater than the first distance, an occupation area of the integrated circuit is increased, resulting in a lower production yield. In some instances, if the inductor is separated from the first or second device by a distance less than the first distance, the physical and electrical isolation between the inductor and the first or second device is insufficient resulting in inferior electrical properties and/or an increase in electromagnetic interference (EMI) between the inductor and the first or second device.

In some embodiments, the inductor is on the backside of a first semiconductor wafer. In some embodiments, by positioning the inductor on the backside of the first semiconductor wafer, the inductor is separated from the first or second device by at least the first distance resulting in no keep out zone (KOZ) on the front side of the first semiconductor wafer. In some embodiments, a keep out zone is a region where no devices are placed within, and can be defined by a minimum distance between the devices and other items.

In some embodiments, by not having a KOZ on the front side of the first semiconductor wafer, additional routing resources are available on the front side of the first semiconductor wafer yielding an increase in the routing area of the integrated circuit compared with other approaches.

In some embodiments, by not having a KOZ on the front side of the first semiconductor wafer, the area of the first or second device can be increased compared with other approaches. In some embodiments, by positioning the inductor on the backside of the first semiconductor wafer, the inductor is separated from the devices by at least the first distance resulting in less electromagnetic interference (EMI) between the inductor and the one or more device. In some embodiments, by positioning the inductor on the backside of the first semiconductor wafer, the inductor has at least a similar resistance as other approaches.

Figure 1B:
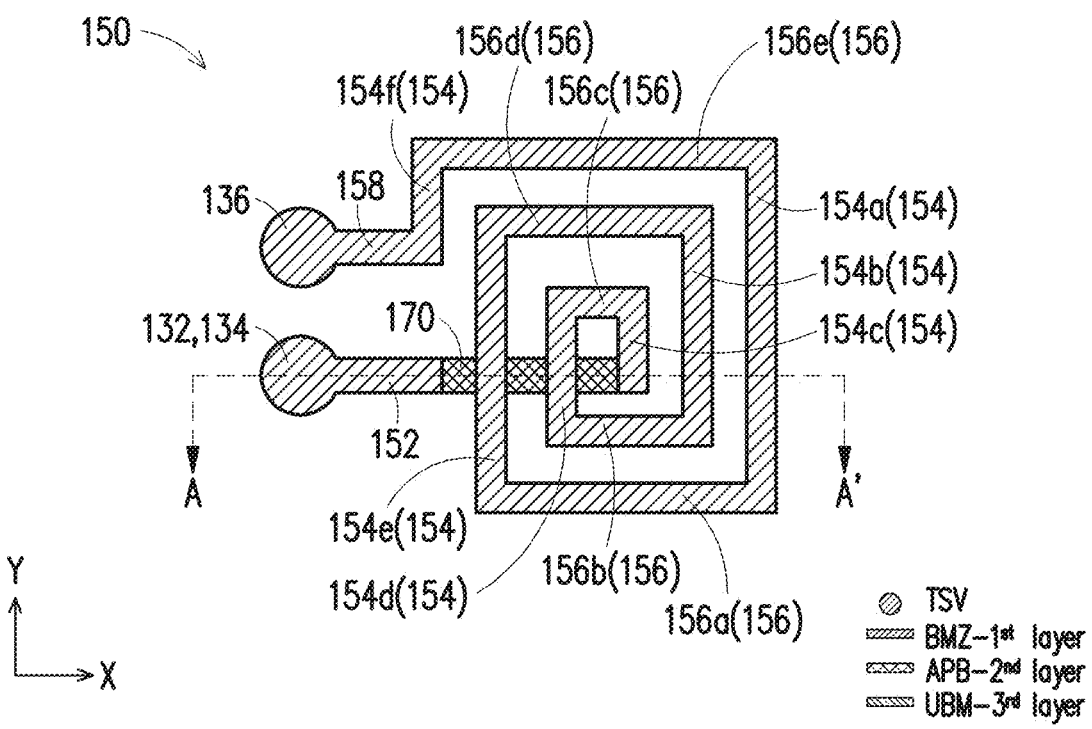
FIG. 1B is a top view of an inductor portion of an integrated circuit, in accordance with some embodiments.
Figure 1C:
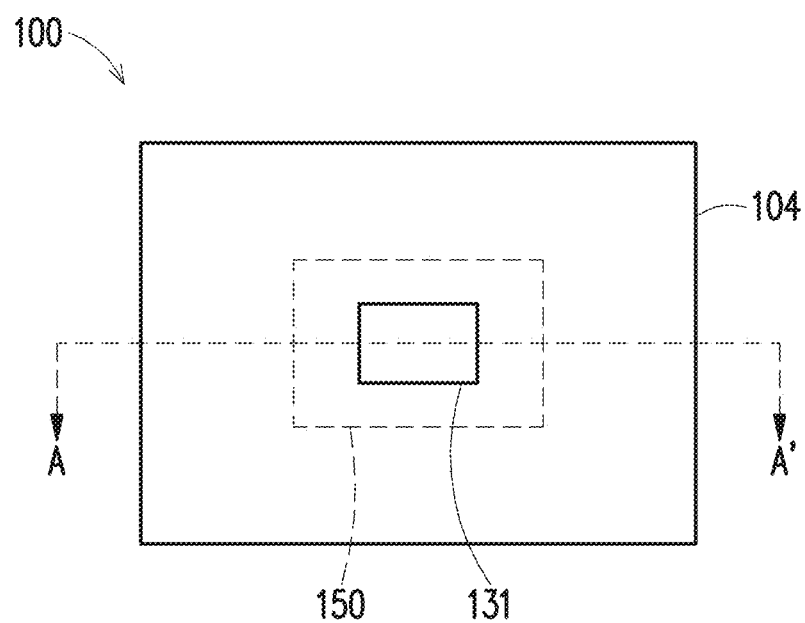
FIG. 1C is a top view of an integrated circuit, in accordance with some embodiments.

FIGS. 1A, 1B and 1C are diagrams of at least a portion of an integrated circuit 100, in accordance with some embodiments. FIG. 1A is a cross-sectional view of integrated circuit 100 as intersected by plane A-A', FIG. 1B is a top view of an inductor portion of Integrated circuit 100, and FIG. 1C is a top view of Integrated circuit 100, in accordance with some embodiments. For example, FIG. 1B is a top view of inductor 150 of integrated circuit 100, in accordance with some embodiments.

Integrated circuit 100 includes a semiconductor wafer 102 bonded to a semiconductor wafer 104.

Semiconductor wafer 102 includes one or more device regions 130 in a semiconductor substrate 103. Semiconductor wafer 102 has a front side 102a and a backside 102b.

Semiconductor substrate 103 has a top surface (not labelled) and a bottom surface (not labelled). In some embodiments, semiconductor substrate 103 is made of silicon or other semiconductor materials. In some embodiments, semiconductor substrate 103 includes other elementary semiconductor materials such as germanium. In some embodiments, semiconductor substrate 103 is made of a compound semiconductor, such as silicon carbide, gallium arsenic, indium arsenide, or indium phosphide. In some embodiments, semiconductor substrate 103 is made of an alloy semiconductor such as silicon germanium, silicon germanium carbide, gallium arsenic phosphide, or gallium indium phosphide. In some embodiments, semiconductor substrate 103 includes an epitaxial layer. For example, in some embodiments, semiconductor substrate 103 has an epitaxial layer overlying a bulk semiconductor. Other configurations, arrangements and materials of semiconductor substrate 103 are within the contemplated scope of the present disclosure.

The one or more device regions 130 are in the front-side 102a of semiconductor wafer 102. In some embodiments, the one or more device regions 130 are formed in the front-side 102a of semiconductor wafer 102 in a front-end-of-line (FEOL) process. In some embodiments, the one or more device regions 130 includes a transistor. In some embodiments, the one or more device regions 130 includes an N-type metal-oxide semiconductor (NMOS) transistor and/or P-type metal-oxide semiconductor (PMOS) transistor.

In some embodiments, the one or more device regions 130 includes various NMOS and/or PMOS devices, such as transistors or memories, and the like, interconnected to perform one or more functions. In some embodiments, the one or more device regions 130 includes other devices, such as capacitors, resistors, diodes, photo-diodes, fuses, and the like in substrate 103. In some embodiments, the functions of the devices includes memory, processing, sensors, amplifiers, power distribution, input/output circuitry, or the like. The one or more device regions 130 are merely an example, and other devices may be included in the one or more device regions 130. Other devices, configurations, arrangements and materials of the one or more device regions 130 are within the contemplated scope of the present disclosure.

As shown in FIG. 1A, the one or more devices 130 are formed in the front-side 102a of semiconductor wafer 102, while no devices are formed in a backside 102b of semiconductor wafer 102. In some embodiments, one or more devices 130 are formed in the back side 102b of semiconductor wafer 102. In some embodiments, no devices are formed in the front side 102a of semiconductor wafer 102. In some embodiments, semiconductor wafer 102 has a thickness ranging from about 10 μm to about 200 μm. In some instances, if a thickness of semiconductor wafer 102 is greater than 200 μm, then an occupation area of integrated circuit 100 is increased, resulting in a lower production yield. In some instances, if a thickness of semiconductor wafer 102 is less than 10 μm, then the physical and electrical isolation between one or more of inductor 150, 250 (FIGS. 2A-2B), inductor 350 (FIGS. 3A-3B), inductor 450 (FIGS.

4A-4B), inductor 550 (FIGS. 5A-5B), inductor 650 (FIGS. 6A-6B), inductor 750 (FIGS. 7A-7B), inductor 850 (FIGS. 8A-8B), inductor 950 (FIGS. 9A-9B), inductor 1050 (FIGS. 10A-10B) or inductor 1150 (FIGS. 11A-11B) and the one or more devices 130 or 131 is insufficient resulting in inferior electrical properties and/or an increase in electromagnetic interference (EMI) between inductor 150, 250, 350, 450, 550, 650, 750, 850, 950, 1050 or 1150 and the one or more devices 130 or 131. Other configurations, arrangements and materials of semiconductor wafer 102 are within the contemplated scope of the present disclosure.

Integrated circuit 100 further includes an interconnect structure 106 over the front side 102a of semiconductor wafer 102. In some embodiments, interconnect structure 106 is on the front side 102a of semiconductor wafer 102. In some embodiments, interconnect structure 106 is formed over substrate 103, e.g., over the one or more device regions 130. Interconnect structure 106 includes at least conductive feature 106a or 106b. Conductive feature 106a extends in a first direction X. Conductive feature 106b extends in a second direction Y different from the first direction X. In some embodiments, one or more of conductive structures 106a or 106b are part of an interconnect structure 108 (described below). Conductive structure 106a is electrically coupled to a via 132 (described below). In some embodiments, conductive structure 106a is part of via 132. In some embodiments, conductive structures 106a and 106b are part of the same integral structure. In some embodiments, at least conductive feature 106a or conductive feature 106b electrically couples one or more devices 130 (described below) to one or more devices 131 (described below). In some embodiments, interconnect structure 106 includes one or more contact plugs (not shown) and one or more conductive features (not shown). The conductive features (not shown) of interconnect structure 106, conductive structure 106a or conductive structure 106b are embedded in an insulating material (not labelled). In some embodiments, interconnect structure 106 is formed in a back-end-of-line (BEOL) process. In some embodiments, interconnect structure 106, conductive structure 106a, conductive structure 106b or contact plug (not shown) is made of conductive materials, such as copper, copper alloy, aluminum, alloys or combinations thereof. Conductive features (not shown) are also made of conductive materials. In some embodiments, other applicable materials are used. In some embodiments, interconnect structure 106, conductive structure 106a, conductive structure 106b, contact plug (not shown) and conductive features (not shown) include conductive materials which are heat resistant, such as tungsten (W), Cu, Al, or AlCu. In some embodiments, insulating material (not labelled) is made of silicon oxide. In some embodiments, insulating material (not labelled) includes multiple dielectric layers of dielectric materials. One or more of the multiple dielectric layers are made of low dielectric constant (low-k) materials. In some embodiments, a top dielectric layer of the multiple dielectric layers (not shown) is made of $SiO_2$. Interconnect structure 106 is shown merely for illustrative purposes. Other configurations, arrangements and materials of interconnect structure 106 are within the contemplated scope of the present disclosure. In some embodiments, interconnect structure 106 includes one or more conductive lines and vias.

Integrated circuit 100 further includes a bonding layer 122 on interconnect structure 106. In some embodiments, bonding layer 122 is over the front-side 102a of semiconductor wafer 102. In some embodiments, bonding layer 122 is a dielectric layer. In some embodiments, bonding layer 122 is formed over the front-side 102a of semiconductor wafer 102. In some embodiments, bonding layer 122 is formed on interconnect structure 106. In some embodiments, at least conductive structure 106a or conductive structure 106b is part of bonding layer 122 or bonding layer 124. In some embodiments, at least conductive structure 106a or conductive structure 106b extends through bonding layer 122 to bonding layer 124. In some embodiments, bonding layer 122 includes a silicon-containing dielectric, such as silicon oxide, silicon oxynitride or silane oxide. Other configurations, arrangements and materials of bonding layer 122 are within the contemplated scope of the present disclosure.

Semiconductor wafer 104 includes one or more device regions 131 in a semiconductor substrate 105. Semiconductor wafer 104 has a front side 104a and a backside 104b. Semiconductor substrate 105 has a top surface (not labelled) and a bottom surface (not labelled). In some embodiments, semiconductor substrate 105 is made of silicon or other semiconductor materials. In some embodiments, semiconductor substrate 105 includes other elementary semiconductor materials such as germanium. In some embodiments, semiconductor substrate 105 is made of a compound semiconductor, such as silicon carbide, gallium arsenic, indium arsenide, or indium phosphide. In some embodiments, semiconductor substrate 105 is made of an alloy semiconductor such as silicon germanium, silicon germanium carbide, gallium arsenic phosphide, or gallium indium phosphide. In some embodiments, semiconductor substrate 105 includes an epitaxial layer. For example, in some embodiments, semiconductor substrate 105 has an epitaxial layer overlying a bulk semiconductor. Other configurations, arrangements and materials of semiconductor substrate 105 are within the contemplated scope of the present disclosure.

The one or more device regions 131 are in the front-side 104a of semiconductor wafer 104. In some embodiments, the one or more device regions 131 are formed in the front side 104a of semiconductor wafer 104 in a FEOL process. In some embodiments, no devices are formed in the front side 104a of semiconductor wafer 104. In some embodiments, the one or more devices 131 are formed in the backside 104b of semiconductor wafer 104. In some embodiments, no devices are formed in the backside 104b of semiconductor wafer 104. Other configurations, arrangements and materials of semiconductor wafer 104 are within the contemplated scope of the present disclosure.

In some embodiments, the one or more device regions 131 are the same as the one or more device regions 130. In some embodiments, the one or more device regions 131 includes a transistor. In some embodiments, the one or more device regions 131 includes an NMOS transistor and/or a PMOS transistor. In some embodiments, the one or more device regions 131 includes various NMOS and/or PMOS devices, such as transistors or memories, and the like, interconnected to perform one or more functions. In some embodiments, the one or more device regions 131 includes other devices, such as capacitors, resistors, diodes, photo-diodes, fuses, and the like in substrate 105. In some embodiments, the functions of the devices includes memory, processing, sensors, amplifiers, power distribution, input/output circuitry, or the like. The one or more device regions 131 are merely an example, and other devices may be included in the one or more device regions 131. Other devices, configurations, arrangements and materials of the one or more device regions 131 are within the contemplated scope of the present disclosure.

Integrated circuit 100 further includes an interconnect structure 108 contacting the front side 104a of semiconductor wafer 104. In some embodiments, interconnect structure 108 is on the front side 104a of semiconductor wafer 104. In some embodiments, interconnect structure 108 is formed over substrate 105, e.g., over the one or more device regions 131. In some embodiments, the one or more conductive structures 106a or 106b are part of interconnect structure 108. In some embodiments, a portion of at least conductive structure 106a or 106b is part of interconnect structure 108. In some embodiments, interconnect structure 108 includes one or more contact plugs (not shown) or one or more conductive features (not shown). The conductive features (not shown) of interconnect structure 108 are embedded in an insulating material (not labelled). In some embodiments, interconnect structure 108 is formed in a BEOL process. In some embodiments, contact plug (not shown) is made of conductive materials, such as copper, copper alloy, aluminum, alloys or combinations thereof. Conductive features (not shown) are also made of conductive materials. In some embodiments, other applicable materials are used. In some embodiments, contact plug (not shown) and conductive features (not shown) include conductive materials which are heat resistant, such as tungsten (W), Cu, Al, or AlCu. In some embodiments, insulating material (not labelled) is made of silicon oxide. In some embodiments, insulating material (not labelled) includes multiple dielectric layers of dielectric materials. One or more of the multiple dielectric layers are made of low dielectric constant (low-k) materials. In some embodiments, a top dielectric layer of the multiple dielectric layers (not shown) is made of $SiO_2$. Interconnect structure 108 shown is merely for illustrative purposes. Other configurations, arrangements and materials of interconnect structure 108 are within the contemplated scope of the present disclosure. In some embodiments, interconnect structure 108 includes one or more conductive lines and vias.

Integrated circuit 100 further includes a bonding layer 124 contacting interconnect structure 108. In some embodiments, bonding layer 124 is on interconnect structure 108. In some embodiments, bonding layer 124 is over the front-side 104a of semiconductor wafer 104. In some embodiments, bonding layer 124 is a dielectric layer. In some embodiments, bonding layer 124 is formed over the front-side 104a of semiconductor wafer 104. In some embodiments, bonding layer 124 is formed on interconnect structure 108. In some embodiments, at least a portion of conductive structure 106a or conductive structure 106b extends through bonding layer 122 or 124. In some embodiments, bonding layer 124 includes a silicon-containing dielectric, such as silicon oxide, silicon oxynitride or silane oxide. Other configurations, arrangements and materials of bonding layer 124 are within the contemplated scope of the present disclosure.

Integrated circuit 100 further includes a bonding interface 120 between bonding layer 122 and bonding layer 124. In some embodiments, the bonding interface 120 extends in a first direction X. Bonding layer 122 is bonded to bonding layer 124 through bonding interface 120. In some embodiments, the front side 102a of semiconductor wafer 102 is bonded to the front side 104a of semiconductor wafer 104 through bonding interface 120. In some embodiments, interconnect structure 106 is bonded to interconnect structure 108 by bonding layers 122 and 124. In some embodiments, the front side 102a of semiconductor wafer 102 is separated from the bonding interface 120 in the second direction Y by a distance D1. In some embodiments, the distance D1 ranges from about 5 μm to about 10 μm. In some embodiments, the front side 104a of semiconductor wafer 104 is separated from the bonding interface 120 in the second direction Y by distance D1.

Integrated circuit 100 further includes a through substrate via (TSV) 132 which extends through the semiconductor wafer 102. In some embodiments, TSV 132 extends partially into an interconnect structure 110 or 106. TSV 132 is configured to provide electrical connections and for heat dissipation for integrated circuit 100. Although FIG. 1A shows one TSV (e.g., TSV 132), more than one TSV 132 may be formed to pass through semiconductor wafer 102 in FIGS. 1A-11A.

In some embodiments, TSV 132 includes a liner (not shown), a diffusion barrier layer (not shown), and a conductive material (not shown). The diffusion barrier layer (not shown) is used to prevent conductive material (not shown) from migrating to the one or more device regions 130 and 131. The liner (not shown) includes an insulating material, such as oxides, nitrides, or combinations thereof. In some embodiments, diffusion barrier layer (not shown) includes Ta, TaN, Ti, TiN or CoW, or combinations thereof. In some embodiments, conductive material (not shown) includes copper, copper alloy, aluminum, aluminum alloys, or combinations thereof. In some embodiments, other applicable materials are used for at least the liner (not shown), the diffusion barrier layer (not shown) or the conductive material (not shown). Other configurations, arrangements, materials and quantities of TSV 132 are within the contemplated scope of the present disclosure.

Integrated circuit 100 further includes an interconnect structure 110 on the backside 102b of semiconductor wafer 102. In some embodiments, interconnect structure 110 is formed on the backside 102b of semiconductor wafer 102. In some embodiments, interconnect structure 110 is below semiconductor wafer 102. In some embodiments, interconnect structure 110 is configured to provide an electrical connection between interconnect structure 106 and a set of solder balls 114. In some embodiments, interconnect structure 110 is electrically connected to semiconductor wafer 102 via TSV 132.

Interconnect structure 110 includes one or more conductive features, such as conductive lines (not shown), vias (not shown), or conductive pads (not shown), formed in an insulating material 140. In some embodiments, the one or more conductive features, such as the conductive lines (not shown), the vias (not shown), or the conductive pads (not shown), formed in insulating material 140 of interconnect structure 110 is referred to as one or more redistribution layers (RDL) of integrated circuit 100. The routings of the conductive features shown in FIG. 1A are merely examples. Other configurations, arrangements and materials of the conductive features of the interconnect structure 110 are within the contemplated scope of the present disclosure.

In some embodiments, interconnect structure 110 further includes an inductor 150. Inductor 150 is located below semiconductor wafer 102 or 104. In some embodiments, inductor 150 is electrically connected to the one or more devices 130 or 131 by TSV 132, conductive feature 106a and conductive feature 106b. In some embodiments, inductor 150 is electrically connected to the one or more devices 130 by TSV 132 and interconnect structure 106. In some embodiments, inductor 150 is electrically connected to the one or more devices 131 by TSV 132 and interconnect structure 106 or 108. In some embodiments, inductor 150 is formed of one or more conductive features of one or more RDLs of integrated circuit 100.

Inductor 150, inductor 250 (FIG. 2B), inductor 350 (FIG. 3B), inductor 450 (FIG. 4B), inductor 550 (FIG. 5B) is a spiral inductor. In some embodiments, other types of inductors are within the contemplated scope of the present disclosure. In some embodiments, inductor 150, 250, 350, 450 or 550 has an integer number of turns. In some embodiments, other number of turns for the inductor are within the contemplated scope of the present disclosure. In some embodiments, inductor 150, 250, 350, 450 or 550 is a separate structure from interconnect structure 110, and is therefore not part of interconnect structure 110. In some embodiments, inductor 150, 250, 350 or 450 is an air core inductor.

Inductor 150 includes a first terminal 134, a second terminal 136, a conductive portion 152, a set of conductive portions 154, a set of conductive portions 156, a conductive portion 158, a via 160, a via 162 and a conductive portion 170.

In some embodiments, first terminal 134 is an input terminal of inductor 150 and second terminal 136 is an output terminal of inductor 150. In some embodiments, first terminal 134 is the output terminal of inductor 150 and second terminal 136 is the input terminal of inductor 150. In some embodiments, the first terminal 134 corresponds to a bottom portion of TSV 132. In some embodiments, the second terminal 136 corresponds to a bottom portion of a TSV (not shown). In some embodiments, first terminal 134 or second terminal 136 is a conductive portion. In some embodiments, other numbers of terminals of are within the contemplated scope of the present disclosure.

Conductive portion 152 extends in a first direction X, and is on a first layer of interconnect structure 110. Conductive portion 152 is electrically coupled to TSV 132 by first terminal 134. In some embodiments, conductive portion 152 is electrically coupled to and directly contacts first terminal 134. In some embodiments, conductive portion 152 and first terminal 134 are a single conductive portion.

The set of conductive portions 154 includes one or more of conductive portions 154a, 154b, 154c, 154d, 154e and 154f. At least one conductive portion of the set of conductive portions 154 extends in a second direction Y different from the first direction X. At least one conductive portion of the set of conductive portions 154 is on the first layer of interconnect structure 110. Each conductive portion of the set of conductive portions 154 is separated from another conductive portion of the set of conductive portions 154 in at least the first direction X by insulating material 140. Conductive portion 152 is separated from conductive portion 154e of the set of conductive portions 156 in at least the first direction X by insulating layer 140. In some embodiments, the first layer of interconnect structure 110 is referred to as a backside metal (Mz) RDL. In some embodiments, the backside metal (Mz) is abbreviated as BMZ.

The set of conductive portions 156 includes one or more of conductive portions 156a, 156b, 156c, 156d and 156e. At least one conductive portion of the set of conductive portions 156 extends in the first direction X, and is on the first layer of interconnect structure 110. Each conductive portion of the set of conductive portions 156 is separated from another conductive portion of the set of conductive portions 156 in at least the second direction Y by insulating material 140.

Conductive portion 158 extends in the first direction X, and is on the first layer of interconnect structure 110. Conductive portion 158 is electrically coupled to another TSV (not shown) by second terminal 136. In some embodiments, conductive portion 158 is electrically coupled to and directly contacts second terminal 136. In some embodiments, conductive portion 158 and second terminal 136 are a single conductive portion.

In some embodiments, conductive portion 158, the conductive portions of the set of conductive portions 154 and the conductive portions of the set of conductive portions 156 are a single conductive portion. In some embodiments, the conductive portions of the set of conductive portions 154 are directly coupled to corresponding conductive portions of the set of conductive portions 156 in a spiral arrangement.

In some embodiments, conductive portion 154c is electrically coupled to and directly contacts conductive portion 156c. In some embodiments, conductive portion 156c is electrically coupled to and directly contacts conductive portion 154d. In some embodiments, conductive portion 154d is electrically coupled to and directly contacts conductive portion 156b. In some embodiments, conductive portion 156b is electrically coupled to and directly contacts conductive portion 154b. In some embodiments, conductive portion 154b is electrically coupled to and directly contacts conductive portion 156d. In some embodiments, conductive portion 156d is electrically coupled to and directly contacts conductive portion 154e. In some embodiments, conductive portion 154e is electrically coupled to and directly contacts conductive portion 156a. In some embodiments, conductive portion 156a is electrically coupled to and directly contacts conductive portion 154a. In some embodiments, conductive portion 154a is electrically coupled to and directly contacts conductive portion 156e. In some embodiments, conductive portion 156e is electrically coupled to and directly contacts conductive portion 154f. In some embodiments, conductive portion 154f is electrically coupled to and directly contacts conductive portion 158. In some embodiments, conductive portion 158 is electrically coupled to and directly contacts second terminal 136.

Conductive portion 170 extends in the first direction X, and is on a second layer of interconnect structure 110 different from the first layer of interconnect structure 110. First layer of interconnect structure 110 corresponds to a metal layer of interconnect structure 110, and second layer of interconnect structure 110 corresponds to another metal layer of interconnect structure 110. In some embodiments, the second layer of interconnect structure 110 is referred to as a backside APB RDL. In some embodiments, the backside APB RDL includes AlCu or the like. Other configurations, arrangements and materials of metal layers in interconnect structure 110 are within the contemplated scope of the present disclosure.

Via 160 or via 162 is on a layer of interconnect structure 110 between the first layer and the second layer of interconnect structure 110. In some embodiments, a first via layer is a layer between the first layer and the second layer of interconnect structure 110.

Via 160 electrically couples conductive portion 152 to conductive portion 170.

Via 162 electrically couples conductive portion 170 to conductive portion 154c of the set of conductive portions 154.

In some embodiments, first terminal 134, second terminal 136, at least one of conductive portion 152, one or more of the set of conductive portions 154, one or more of the set of conductive portions 156, conductive portion 170, via 160 or via 162 is made of a conductive material, such as copper, copper alloy, aluminum, alloys, nickel, tungsten, titanium, or combinations thereof. In some embodiments, other applicable conductive materials are used.

In some embodiments, a thickness of conductive portion 152, a thickness of one or more of the set of conductive portions 154 or a thickness of one or more of the set of conductive portions 156 ranges from about 0.5 µm to about 2 µm. In some embodiments, a thickness of conductive portion 170 ranges from about 2 µm to about 10 µm.

In some embodiments, insulating material 140 includes a dielectric layer or a polymer layer. In some embodiments, insulating material 140 includes polyimide, polybenzoxazole (PBO), benzocyclobutene (BCB), an ajinomoto buildup film (ABF), a solder resist film (SR), or the like.

In some embodiments, insulating material 140 includes silicon oxide, silicon nitride, silicon carbide, silicon oxynitride, or the like. In some embodiments, insulating material 140 includes multiple dielectric layers of dielectric materials. One or more of the multiple dielectric layers are made of low dielectric constant (low-k) materials. In some embodiments, a top dielectric layer of the multiple dielectric layers (not shown) is made of $SiO_2$.

Inductor 150 is located below the one or more devices 130 or 131. In some embodiments, inductor 150 is separated from the one or more devices 130 in the second direction Y by a distance D2. In some embodiments, the distance D2 ranges from about 10 µm to about 200 µm. In some instances, if the distance D2 is greater than 200 µm, then an occupation area of integrated circuit 100, integrated circuit 200 (FIGS. 2A-2B), integrated circuit 300 (FIGS. 3A-3B), integrated circuit 400 (FIGS. 4A-4B), integrated circuit 500 (FIGS. 5A-5B), integrated circuit 600 (FIGS. 6A-6B), integrated circuit 700 (FIGS. 7A-7B), integrated circuit 800 (FIGS. 8A-8B), integrated circuit 900 (FIGS. 9A-9B), integrated circuit 1000 (FIGS. 10A-10B) or integrated circuit 1100 (FIGS. 11A-11B) is increased, resulting in a lower production yield. In some instances, if the distance D2 is less than 10 µm, then the physical and electrical isolation between inductor 150, inductor 250 (FIGS. 2A-2B), inductor 350 (FIGS. 3A-3B), inductor 450 (FIGS. 4A-4B), inductor 550 (FIGS. 5A-5B), inductor 650 (FIGS. 6A-6B), inductor 750 (FIGS. 7A-7B), inductor 850 (FIGS. 8A-8B), inductor 950 (FIGS. 9A-9B), inductor 1050 (FIGS. 10A-10B) or inductor 1150 (FIGS. 11A-11B) and the one or more devices 130 or 131 is insufficient resulting in inferior electrical properties and/or an increase in electromagnetic interference (EMI) between inductor 150, 250, 350, 450, 550, 650, 750, 850, 950, 1050 or 1150 and the one or more devices 130 or 131.

In some embodiments, inductor 150 is on the backside 102b of semiconductor wafer 102. In some embodiments, by positioning inductor 150 on the backside 102b of semiconductor wafer 102, inductor 150 is separated from the one or more devices 130 or 131 by at least a distance D2 resulting in no keep out zone (KOZ) on the front side 102a of semiconductor wafer 102. In some embodiments, a keep out zone is a region where no devices are placed within, and can be defined by a minimum distance between the devices and other items. In some embodiments, by not having a keep out zone on the front side 102a of semiconductor wafer 102, additional routing resources are available on the front side 102a of semiconductor wafer 102 yielding an increase in the routing area of integrated circuit 100 compared with other approaches. In some embodiments, by not having a keep out zone on the front side 102a of semiconductor wafer 102, the area of the one or more devices 130 can be increased compared with other approaches. In some embodiments, by positioning inductor 150 on the backside 102b of semiconductor wafer 102, inductor 150 is separated from the one or more devices 130 by at least distance D2 resulting in less electromagnetic interference (EMI) between inductor 150 and the one or more devices 130 or 131. In some embodiments, by positioning inductor 150 on the backside 102b of semiconductor wafer 102, inductor 150 has at least a similar resistance as other approaches. In some embodiments, each of the advantages of inductor 150 described herein are also applicable to at least inductor 250 (FIGS. 2A-2B), inductor 350 (FIGS. 3A-3B), inductor 450 (FIGS. 4A-4B), inductor 550 (FIGS. 5A-5B), inductor 650 (FIGS. 6A-6B), inductor 750 (FIGS. 7A-7B), inductor 850 (FIGS. 8A-8B), inductor 950 (FIGS. 9A-9B), inductor 1050 (FIGS. 10A-10B) or inductor 1150 (FIGS. 11A-11B). Other configurations, arrangements and materials of inductor 150 are within the contemplated scope of the present disclosure.

Integrated circuit 100 further includes an under bump metallurgy (UBM) layer 112 on a surface of the interconnect structure 110. In some embodiments, the UBM layer includes one or more conductive portions 112a, 112b, . . . , 112f where f is an integer corresponding to the number of conductive portions in the UBM layer 112. In some embodiments, UBM layer 112 is formed on the surface of the interconnect structure 110. In some embodiments, UBM layer 112 is formed on a metal pad (not shown). In some embodiments, UBM layer 112 includes an adhesion layer and/or a wetting layer. In some embodiments, UBM layer 112 includes at least a copper seed layer. In some embodiments, UBM layer 112 includes titanium (Ti), titanium nitride (TiN), tantalum nitride (TaN), tantalum (Ta), or the like. Other configurations, arrangements and materials of UBM layer 112 are within the contemplated scope of the present disclosure.

Integrated circuit 100 further includes a set of solder bumps 114 on the UBM layer 112. The set of solder bumps 114 includes one or more solder bumps 114a', 114b', . . . , 114f', where f' is an integer corresponding to the number of solder bumps in the set of solder bumps 114. In some embodiments, the set of solder bumps 114 is formed over UBM layer 112. In some embodiments, one or more solder bumps 114a', 114b', . . . , 114f' of the set of solder bumps 114 includes a conductive material having a low resistivity, such as solder or a solder alloy. In some embodiments, a solder alloy includes Sn, Pb, Ag, Cu, Ni, Bi, or combinations thereof. Other configurations, arrangements and materials of the set of solder bumps 114 are within the contemplated scope of the present disclosure.

In some embodiments, integrated circuit 100 is electrically connected to one or more other package structures (not shown) on the backside 104b of semiconductor wafer 104 or by the set of bumps 114.

Figure 2A:
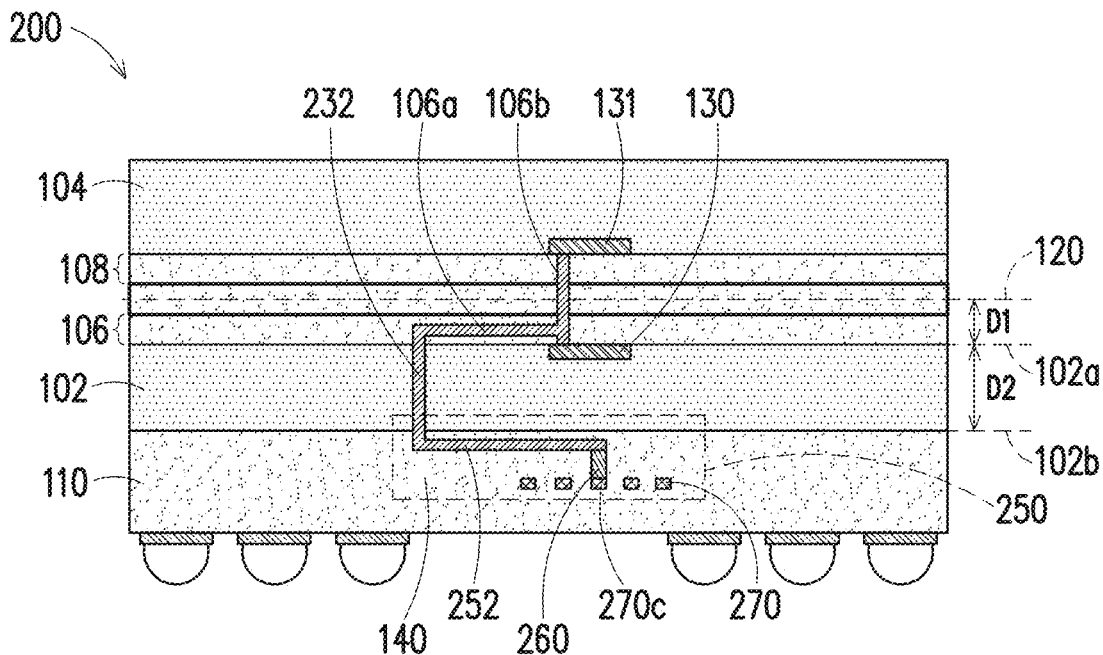
FIG. 2A is a cross-sectional view of an integrated circuit, in accordance with some embodiments.
Figure 2B:
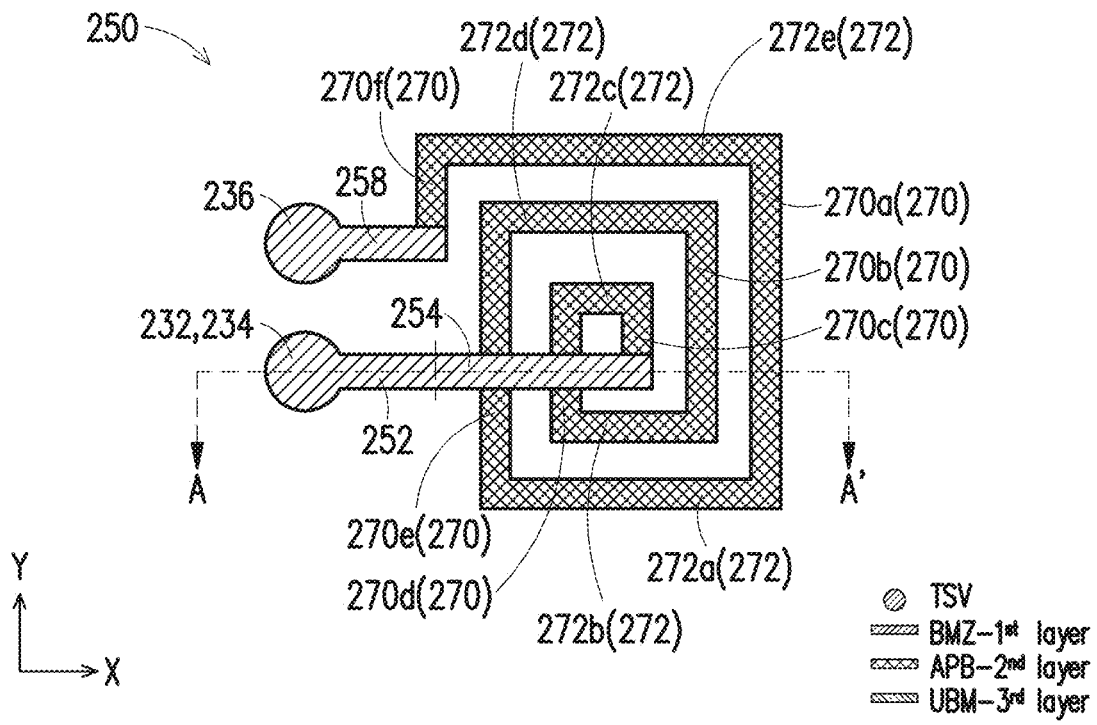
FIG. 2B is a top view of an inductor portion of an integrated circuit, in accordance with some embodiments.

FIGS. 2A and 2B are diagrams of at least a portion of an integrated circuit 200, in accordance with some embodiments. FIG. 2A is a cross-sectional view of integrated circuit 200, and FIG. 2B is a top view of an inductor portion of integrated circuit 200, in accordance with some embodiments. For brevity, FIGS. 2A-11A do not show integrated circuits 200-1100 intersected by plane A-A'. However, it is understood that the cross-sectional views of FIGS. 2A-11A are the result of integrated circuit 100 of FIG. 1C being replaced with corresponding integrated circuits 200-1100. In other words, FIG. 1C can be modified by replacing integrated circuit 100 of FIG. 1C with integrated circuit 200-1100 (FIGS. 2A-11A). FIG. 2A is a cross-sectional view of integrated circuit 200 as intersected by plane A-A', and FIG. 2B is a top view of inductor 250 of integrated circuit 200, in accordance with some embodiments.

Integrated circuit 200 is a variation of integrated circuit 100 (FIGS. 1A-1C). For example, integrated circuit 200 includes an inductor 250 rather than inductor 150 of integrated circuit 100 of FIGS. 1A-1B. Components that are the same or similar to those in FIGS. 2A-2B, 3A-3B, 4A-4B, 5A-5B, 6A-6B, 7A-7B, 8A-8B, 9A-9B, 10A-10B and 11A-

11B are given the same reference numbers, and detailed description thereof is thus omitted.

In comparison with integrated circuit 100 of FIGS. 1A-1B, TSV 232 of integrated circuit 200 replaces TSV 132, and inductor 250 of integrated circuit 200 replaces inductor 150.

TSV 232 is similar to TSV 132 of FIGS. 1A-1B, and similar detailed description is therefore omitted. Inductor 250 is similar to inductor 150 of FIGS. 1A-1B, and similar detailed description is therefore omitted. In some embodiments, inductor 250 is formed of one or more conductive features of one or more RDLs on the first layer and the second layer of interconnect structure 110.

Inductor 250 includes a first terminal 234, a second terminal 236, a conductive portion 252, a conductive portion 254, a conductive portion 258, a set of conductive portions 270, a set of conductive portions 272 and a via 260.

First terminal 234 is similar to first terminal 134 of FIGS. 1A-1B, second terminal 236 is similar to second terminal 136 of FIGS. 1A-1B, conductive portion 252 is similar to conductive portion 152 of FIGS. 1A-1B, conductive portion 258 is similar to conductive portion 158 of FIGS. 1A-1B, and similar detailed descriptions are therefore omitted.

Conductive portion 254 extends in the first direction X, and is on the first layer of interconnect structure 110. Conductive portion 254 is electrically coupled to conductive portion 252. In some embodiments, conductive portions 252 and 254 are a single conductive portion. In some embodiments, conductive portion 254 overlaps at least conductive portion 270c, 270d or 270e.

Via 260 is on the layer of interconnect structure 110 between the first layer and the second layer of interconnect structure 110. Via 260 electrically couples conductive portion 254 to conductive portion 270c of the set of conductive portions 270.

The set of conductive portions 270 includes one or more of conductive portions 270a, 270b, 270c, 270d, 270e and 270f. At least one conductive portion of the set of conductive portions 270 extends in the second direction Y. At least one conductive portion of the set of conductive portions 270 is on the second layer of interconnect structure 110. Each conductive portion of the set of conductive portions 270 is separated from another conductive portion of the set of conductive portions 270 in at least the first direction X by insulating material 140. In some embodiments, conductive portion 270f of the set of conductive portions 270 is electrically coupled to conductive portion 258 by a via (not shown).

The set of conductive portions 272 includes one or more of conductive portions 272a, 272b, 272c, 272d and 272e. At least one conductive portion of the set of conductive portions 272 extends in the first direction X, and is on the second layer of interconnect structure 110. Each conductive portion of the set of conductive portions 272 is separated from another conductive portion of the set of conductive portions 272 in at least the second direction Y by insulating material 140.

In some embodiments, the conductive portions of the set of conductive portions 270 and the conductive portions of the set of conductive portions 272 are a single conductive portion. In some embodiments, the conductive portions of the set of conductive portions 270 are directly coupled to corresponding conductive portions of the set of conductive portions 272 in a spiral arrangement.

In some embodiments, conductive portion 270c is electrically coupled to and directly contacts conductive portion 272c. In some embodiments, conductive portion 272c is electrically coupled to and directly contacts conductive portion 270d. In some embodiments, conductive portion 270d is electrically coupled to and directly contacts conductive portion 272b. In some embodiments, conductive portion 272b is electrically coupled to and directly contacts conductive portion 270b. In some embodiments, conductive portion 270b is electrically coupled to and directly contacts conductive portion 272d. In some embodiments, conductive portion 272d is electrically coupled to and directly contacts conductive portion 270e. In some embodiments, conductive portion 270e is electrically coupled to and directly contacts conductive portion 272a. In some embodiments, conductive portion 272a is electrically coupled to and directly contacts conductive portion 270a. In some embodiments, conductive portion 270a is electrically coupled to and directly contacts conductive portion 272e. In some embodiments, conductive portion 272e is electrically coupled to and directly contacts conductive portion 270f. In some embodiments, conductive portion 270f is electrically coupled to conductive portion 258. In some embodiments, conductive portion 258 is electrically coupled to and directly contacts second terminal 236.

Other configurations, arrangements and materials of inductor 250 are within the contemplated scope of the present disclosure.

Figure 3A:
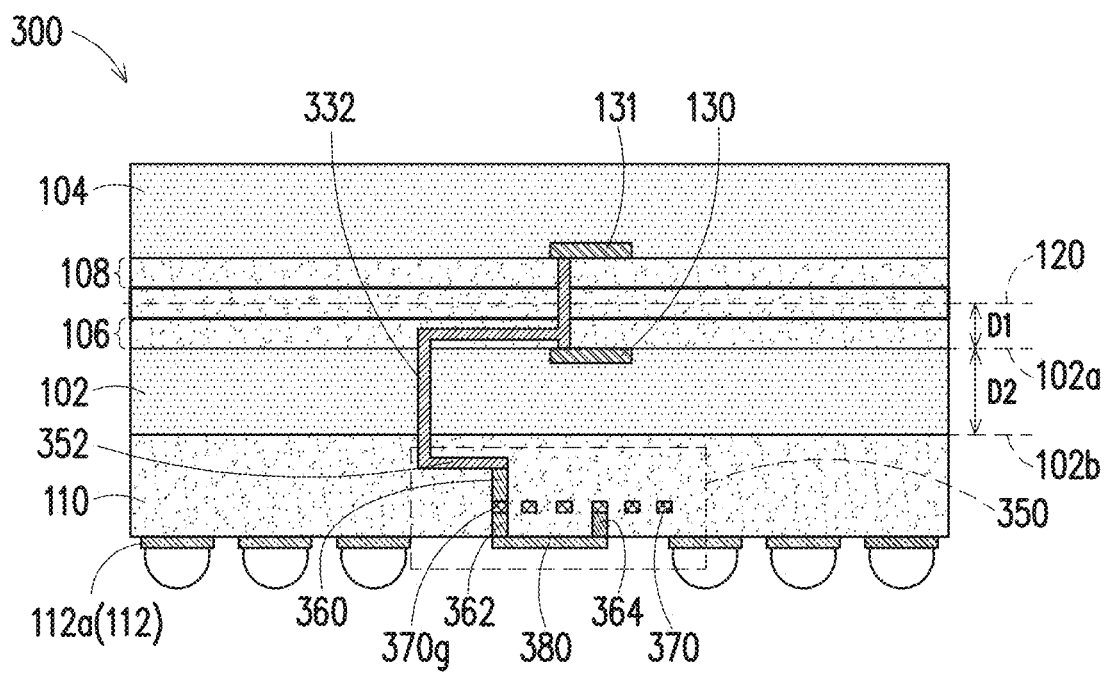
FIG. 3A is a cross-sectional view of an integrated circuit, in accordance with some embodiments.
Figure 3B:
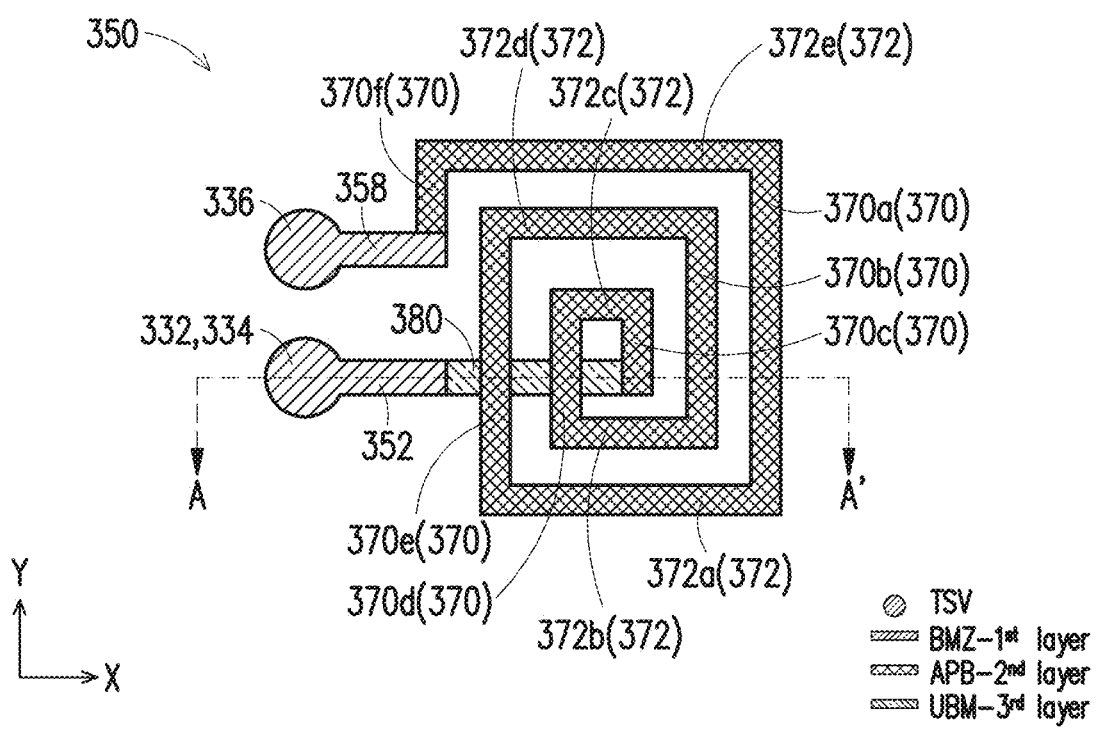
FIG. 3B is a top view of an inductor portion of an integrated circuit, in accordance with some embodiments.

FIGS. 3A and 3B are diagrams of at least a portion of an integrated circuit 300, in accordance with some embodiments. FIG. 3A is a cross-sectional view of integrated circuit 300 as intersected by plane A-A', and FIG. 3B is a top view of an inductor portion of Integrated circuit 300, in accordance with some embodiments. For example, FIG. 3B is a top view of inductor 350 of integrated circuit 300, in accordance with some embodiments.

Integrated circuit 300 is a variation of integrated circuit 100 (FIGS. 1A-1C) or integrated circuit 200 (FIGS. 2A-2B). For example, integrated circuit 300 includes an inductor 350 rather than inductor 150 of integrated circuit 100 of FIGS. 1A-1B.

In comparison with integrated circuit 100 of FIGS. 1A-1B, TSV 332 of integrated circuit 300 replaces TSV 132, and inductor 350 of integrated circuit 300 replaces inductor 150.

TSV 332 is similar to TSV 132 of FIGS. 1A-1B, and similar detailed description is therefore omitted. Inductor 350 is similar to inductor 150 of FIGS. 1A-1B, and similar detailed description is therefore omitted. In some embodiments, inductor 350 is formed of one or more conductive features of one or more RDLs on the first layer and the second layer of interconnect structure 110, and one or more conductive features of the UBM on the third layer of interconnect structure 110.

Inductor 350 includes a first terminal 334, a second terminal 336, a conductive portion 352, a conductive portion 358, a set of conductive portions 370, a set of conductive portions 372, a conductive portion 380, a via 360, a via 362 and a via 364.

First terminal 334 is similar to first terminal 134 of FIGS. 1A-1B, second terminal 336 is similar to second terminal 136 of FIGS. 1A-1B, conductive portion 352 is similar to conductive portion 152 of FIGS. 1A-1B, conductive portion 358 is similar to conductive portion 158 of FIGS. 1A-1B, and set of conductive portions 372 is similar to set of conductive portions 272 of FIGS. 2A-2B, and similar detailed descriptions are therefore omitted.

The set of conductive portions 370 includes one or more of conductive portions 370a, 370b, 370c, 370d, 370e, 370f and 370g. The set of conductive portions 370 is a variation of set of conductive portions 270 of FIGS. 2A-2B. For example, conductive portions 370a, 370b, 370c, 370d, 370e and 370f are corresponding conductive portions 270a, 270b, 270c, 270d, 270e and 270f of FIGS. 2A-2B, and similar detailed descriptions are therefore omitted.

Conductive portion 370g extends in the second direction Y, and is on the second layer of interconnect structure 110. Each conductive portion of the set of conductive portions 370 is separated from another conductive portion of the set of conductive portions 370 in at least the first direction X by insulating material 140. Conductive portion 370g of the set of conductive portions 370 is separated from conductive portion 370f of the set of conductive portions 370 in the second direction Y by insulating material 140. In some embodiments, conductive portion 370f of the set of conductive portions 370 is electrically coupled to conductive portion 358 by a via (not shown).

Via 360 is on the layer of interconnect structure 110 between the first layer and the second layer of interconnect structure 110. In some embodiments, via 360 is on a first via layer of interconnect structure 110. In some embodiments, the first via layer is a layer between the first layer and the second layer of interconnect structure 110. Via 360 electrically couples conductive portion 352 to conductive portion 370g of the set of conductive portions 370. Via 360 is above conductive portion 370g.

Via 362 is on a layer of interconnect structure 110 between the second layer and a third layer of interconnect structure 110. In some embodiments, via 362 is on a second via layer of interconnect structure 110. In some embodiments, the second via layer is a layer between the second layer and the third layer of interconnect structure 110. In some embodiments, the third layer of interconnect structure 110 is different from the first layer and the second layer of interconnect structure 110. In some embodiments, the third layer of interconnect structure 110 is referred to as the UBM layer of interconnect structure 110. Via 362 electrically couples conductive portion 370g of the set of conductive portions 370 to conductive portion 380.

Via 364 is on a layer of interconnect structure 110 between the second layer and the third layer of interconnect structure 110. In some embodiments, via 364 is on the second via layer of interconnect structure 110. Via 364 electrically couples conductive portion 370c of the set of conductive portions 370 to conductive portion 380. Via 362 and via 364 are above conductive portion 380.

Conductive portion 380 extends in the first direction X, and is on the third layer of interconnect structure 110. In some embodiments, conductive portion 380 is overlapped by at least conductive portion 370c, 370d or 370e. In some embodiments, conductive portion 380 is on the surface of interconnect structure 110. In some embodiments, conductive portion 380 is a part of the UBM layer 112 (as described in FIGS. 1A-1C). In some embodiments, conductive portion 380 is formed of the same material as the UBM layer 112 (as described in FIGS. 1A-1C) or formed with the UBM layer 112.

In some embodiments, conductive portions 370a, 370b, 370c, 370d, 370e and 370f of the set of conductive portions 370 and the conductive portions of the set of conductive portions 372 are a single conductive portion. In some embodiments, the electrical coupling arrangement of conductive portions 370a, 370b, 370c, 370d, 370e and 370f of the set of conductive portions 370 and the conductive portions of the set of conductive portions 372 is similar to the electrical coupling of the set of conductive portions 270 and the set of conductive portions 272 of FIGS. 2A-2B, and similar detailed descriptions are therefore omitted.

Other configurations, arrangements and materials of inductor 350 are within the contemplated scope of the present disclosure.

Figure 4A:
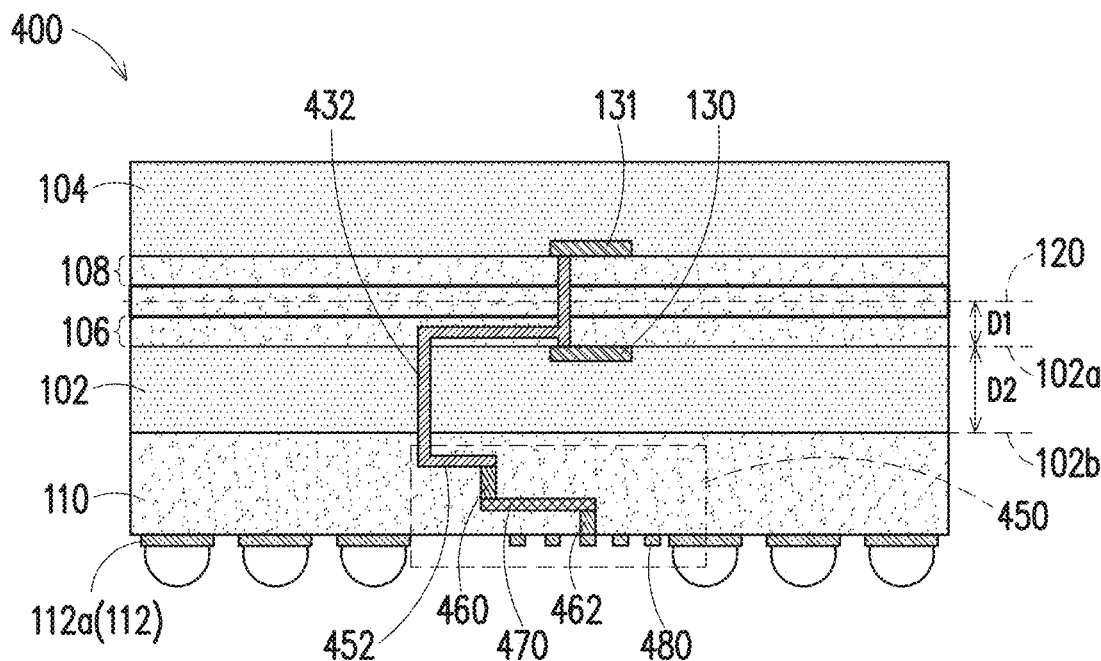
FIG. 4A is a cross-sectional view of an integrated circuit, in accordance with some embodiments.
Figure 4B:
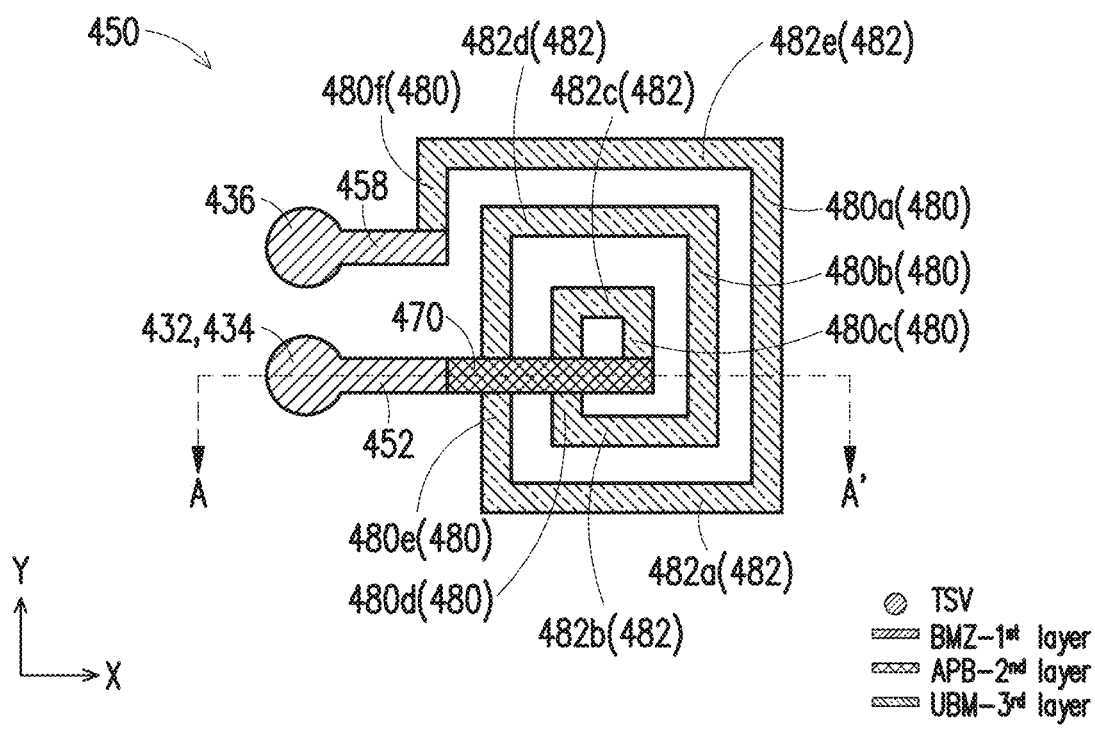
FIG. 4B is a top view of an inductor portion of an integrated circuit, in accordance with some embodiments.

FIGS. 4A and 4B are diagrams of at least a portion of an integrated circuit 400, in accordance with some embodiments. FIG. 4A is a cross-sectional view of integrated circuit 400 as intersected by plane A-A', and FIG. 4B is a top view of an inductor portion of integrated circuit 400, in accordance with some embodiments. For example, FIG. 4B is a top view of inductor 450 of integrated circuit 400, in accordance with some embodiments.

Integrated circuit 400 is a variation of integrated circuit 100 (FIGS. 1A-1C) or integrated circuit 300 (FIGS. 3A-3B). For example, integrated circuit 400 includes an inductor 450 rather than inductor 150 of integrated circuit 100 of FIGS. 1A-1B.

In comparison with integrated circuit 100 of FIGS. 1A-1B, TSV 432 of integrated circuit 400 replaces TSV 132, and inductor 450 of integrated circuit 400 replaces inductor 150.

TSV 432 is similar to TSV 132 of FIGS. 1A-1B, and similar detailed description is therefore omitted. Inductor 450 is similar to inductor 150 of FIGS. 1A-1C, and similar detailed description is therefore omitted. In some embodiments, inductor 450 is formed of one or more conductive features of one or more RDLs on the first layer and the second layer of interconnect structure 110, and one or more conductive features of the UBM on the third layer of interconnect structure 110.

Inductor 450 includes a first terminal 434, a second terminal 436, a conductive portion 452, a conductive portion 458, a via 460, a via 462, a conductive portion 470, a set of conductive portions 480 and a set of conductive portions 482.

First terminal 434 is similar to first terminal 134 of FIGS. 1A-1B, second terminal 436 is similar to second terminal 136 of FIGS. 1A-1B, conductive portion 452 is similar to conductive portion 152 of FIGS. 1A-1B, conductive portion 458 is similar to conductive portion 158 of FIGS. 1A-1B, and conductive portion 470 is similar to conductive portion 170 of FIGS. 1A-1B, and similar detailed descriptions are therefore omitted.

Via 460 is on the layer of interconnect structure 110 between the first layer and the second layer of interconnect structure 110. Via 460 electrically couples conductive portion 452 to conductive portion 470. Via 460 is above conductive portion 470 and below conductive portion 452.

Via 462 is on the layer of interconnect structure 110 between the second layer and the third layer of interconnect structure 110. Via 462 electrically couples conductive portion 470 to conductive portion 480c of the set of conductive portions 480. Via 462 is above conductive portion 480c of the set of conductive portions 480 and below conductive portion 470.

The set of conductive portions 480 includes one or more of conductive portions 480a, 480b, 480c, 480d, 480e and 480f. At least one conductive portion of the set of conductive portions 480 extends in the second direction Y. At least one conductive portion of the set of conductive portions 480 is on the third layer of interconnect structure 110. Each conductive portion of the set of conductive portions 480 is separated from another conductive portion of the set of conductive portions 480 in at least the first direction X by insulating material 140.

The set of conductive portions 482 includes one or more of conductive portions 482a, 482b, 482c, 482d and 482e. At least one conductive portion of the set of conductive portions 482 extends in the first direction X, and is on the third layer of interconnect structure 110. Each conductive portion of the set of conductive portions 482 is separated from another conductive portion of the set of conductive portions 482 in at least the second direction Y by insulating material 140.

In some embodiments, conductive portion 470 overlaps at least conductive portion 480c, 480d or 480e. In some embodiments, one or more of set of conductive portions 480 and 482 is on the surface of interconnect structure 110. In some embodiments, one or more of set of conductive portions 480 and 482 is a part of the UBM layer 112 (as described in FIGS. 1A-1C). In some embodiments, one or more of set of conductive portions 480 and 482 is formed of the same material as the UBM layer 112 (as described in FIGS. 1A-1C) or formed with the UBM layer 112.

In some embodiments, the conductive portions of the set of conductive portions 480 and the conductive portions of the set of conductive portions 482 are a single conductive portion. In some embodiments, the conductive portions of the set of conductive portions 480 are directly coupled to corresponding conductive portions of the set of conductive portions 482 in a spiral arrangement.

In some embodiments, conductive portion 480c is electrically coupled to and directly contacts conductive portion 482c. In some embodiments, conductive portion 482c is electrically coupled to and directly contacts conductive portion 480d. In some embodiments, conductive portion 480d is electrically coupled to and directly contacts conductive portion 482b. In some embodiments, conductive portion 482b is electrically coupled to and directly contacts conductive portion 480b. In some embodiments, conductive portion 480b is electrically coupled to and directly contacts conductive portion 482d. In some embodiments, conductive portion 482d is electrically coupled to and directly contacts conductive portion 480e. In some embodiments, conductive portion 480e is electrically coupled to and directly contacts conductive portion 482a. In some embodiments, conductive portion 482a is electrically coupled to and directly contacts conductive portion 480a. In some embodiments, conductive portion 480a is electrically coupled to and directly contacts conductive portion 482e. In some embodiments, conductive portion 482e is electrically coupled to and directly contacts conductive portion 480f. In some embodiments, conductive portion 480f of the set of conductive portions 480 is electrically coupled to conductive portion 458 by a via (not shown).

Other configurations, arrangements and materials of inductor 450 are within the contemplated scope of the present disclosure.

Figure 5A:
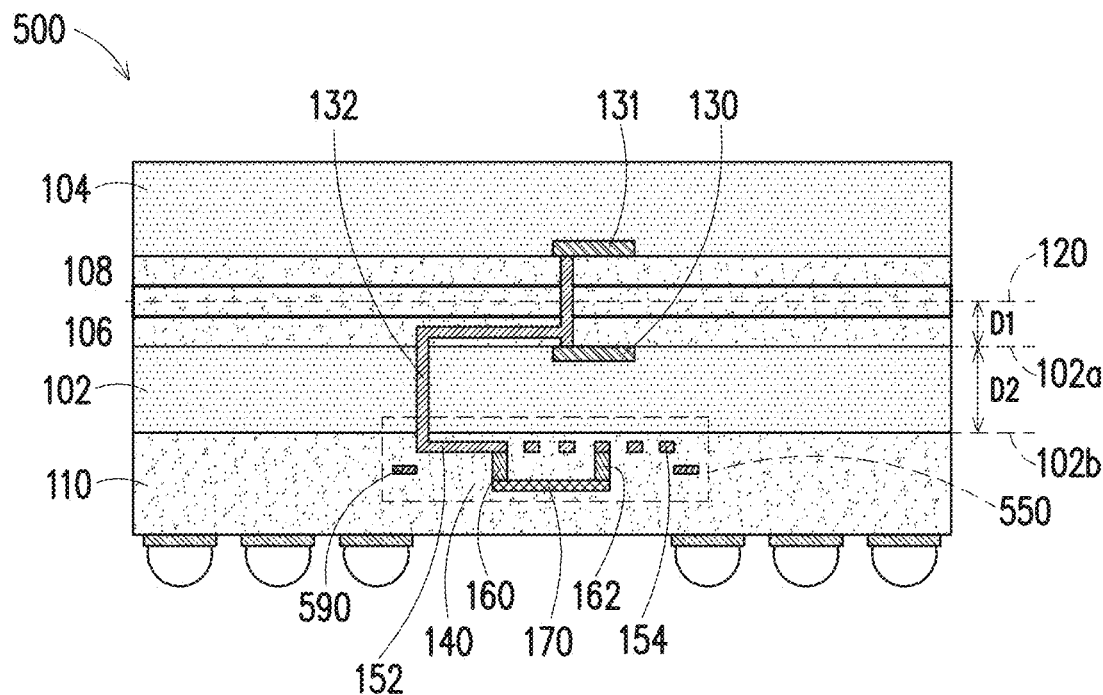
FIG. 5A is a cross-sectional view of an integrated circuit, in accordance with some embodiments.
Figure 5B:
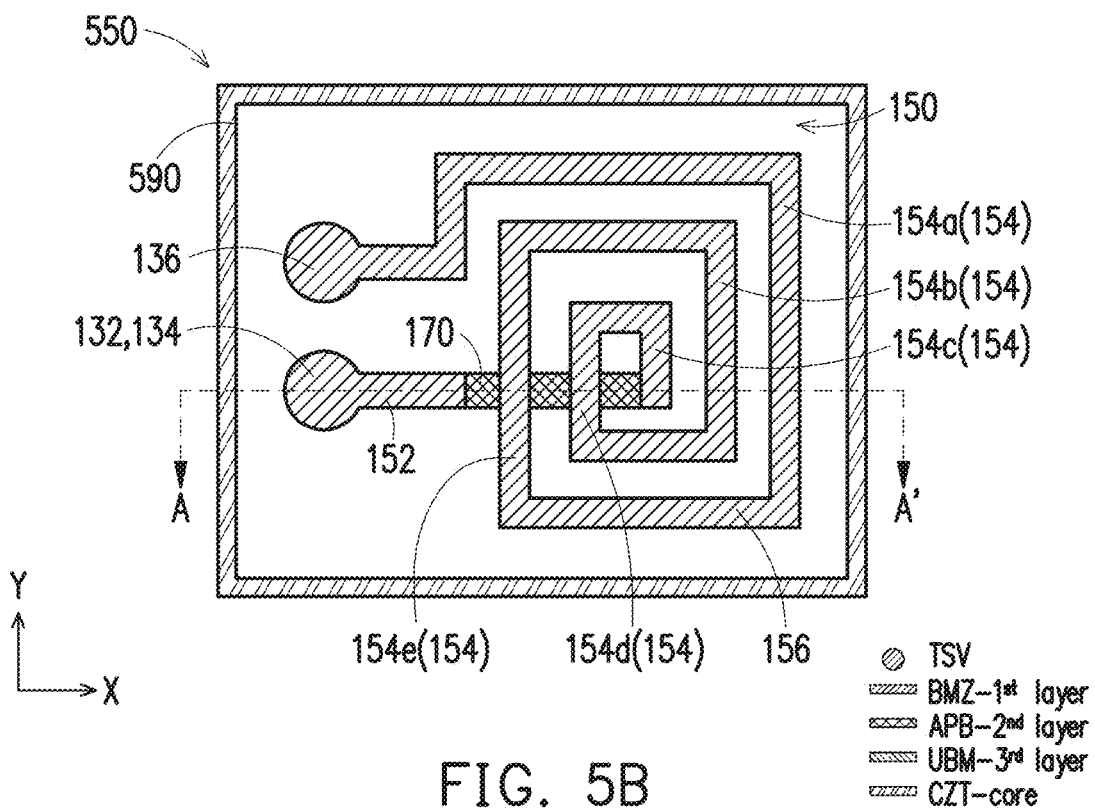
FIG. 5B is a top view of an inductor portion of an integrated circuit, in accordance with some embodiments.

FIGS. 5A and 5B are diagrams of at least a portion of an integrated circuit 500, in accordance with some embodiments. FIG. 5A is a cross-sectional view of integrated circuit 500 as intersected by plane A-A', and FIG. 5B is a top view of an inductor portion of integrated circuit 500, in accordance with some embodiments. For example, FIG. 5B is a top view of inductor 550 of integrated circuit 500, in accordance with some embodiments.

Integrated circuit 500 is a variation of integrated circuit 100 (FIGS. 1A-1C). In comparison with integrated circuit 100 of FIGS. 1A-1B, inductor 550 of integrated circuit 500 replaces inductor 150. Inductor 550 is a variation of inductor 150 (FIGS. 1A-1C), and similar detailed description is therefore omitted. In comparison with inductor 150 of FIGS. 1A-1B, inductor 550 of integrated circuit 500 further includes a core 590.

Each of integrated circuit 200, 300 and 400 of corresponding FIGS. 2A-2B, 3A-3B and 4A-4B can be similarly modified as that shown for FIGS. 5A-5B. For example, in some embodiments, each of integrated circuit 200, 300 and 400 of corresponding FIGS. 2A-2B, 3A-3B and 4A-4B can be similarly modified to further include one or more cores similar to core 590 of FIGS. 5A-5B. In some embodiments, each of inductors 150, 250, 350 and 450 of corresponding FIGS. 1A-1C, 2A-2B, 3A-3B and 4A-4B are referred to as air-core inductors since no magnetic core including a ferromagnetic material is included.

Core 590 is a ferromagnetic material for inductor 550. In some embodiments, core 590 is configured to increase the magnetic field of inductor 550 thereby causing an increase in an inductance of inductor 550. In some embodiments, core 590 is a ferrite material for inductor 550. In some embodiments, core 590 is an iron material for inductor 550. In some embodiments, core 590 includes one or more portions. Core 590 is embedded in insulating material 140. In some embodiments, core 590 is a single layer. In some embodiments, core 590 is multiple layers. Core 590 surrounds inductor 550. In some embodiments, core 590 partially encloses inductor 550. In some embodiments, core 590 is part of interconnect structure 110. In some embodiments, core 590 is a single core. In some embodiments, core 590 is multiple cores.

Core 590 is between the first layer of interconnect structure 110 and the second layer of interconnect structure 110. In some embodiments, core 590 can be positioned on other layers of interconnect structure 110. In some embodiments, core 590 is between the second layer of interconnect structure 110 and the third layer of interconnect structure 110. In some embodiments, core 590 is above the first layer of interconnect structure 110. In some embodiments, inductor 550 is formed of one or more conductive features of one or more RDLs on the first layer and the second layer of interconnect 100.

In some embodiments, core 590 is rectangular or the like. In some embodiments, core 590 is circular or the like. In some embodiments, core 590 is a polygon or the like. In some embodiments, core 590 has a ring-shape or the like. In some embodiments, core 590 is a closed ring or the like. In some embodiments, core 590 is a partially open ring or the like. In some embodiments, core 590 includes a single ring. In some embodiments, core 590 includes multiple rings.

In some embodiments, core 590 includes a ferrite material or other similar materials. In some embodiments, the ferrite material includes one or more of Cobalt, Zirconium or Tantalum (CZT). In some embodiments, the ferrite material includes Co, Zr, Ta, CoZr, Nb, Re, Nd, Pr, Ni, Dy, $Ni_8OFe_2O$, $Ni_5OFe_5O$, CoFeCu, NiFeMo, NiZn, other polymer ferrite materials, or combinations thereof.

Other numbers, configurations, materials and arrangements of core 590 are within the contemplated scope of the present disclosure.

Figure 6A:
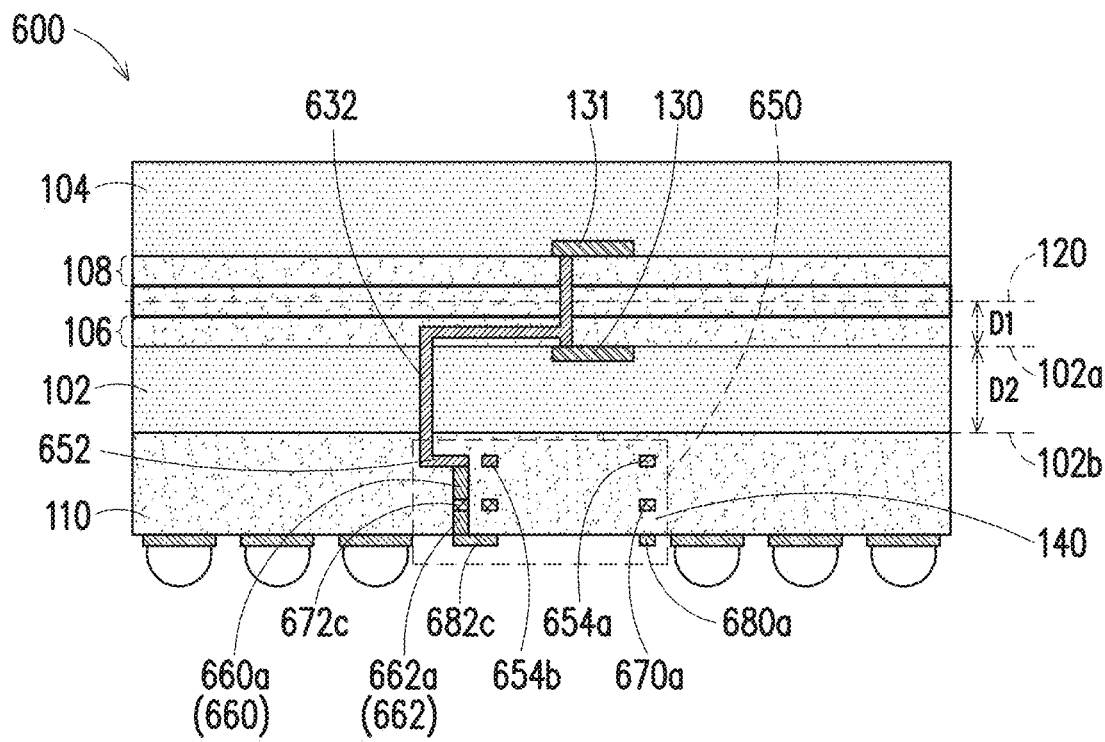
FIG. 6A is a cross-sectional view of an integrated circuit, in accordance with some embodiments.
Figure 6B:
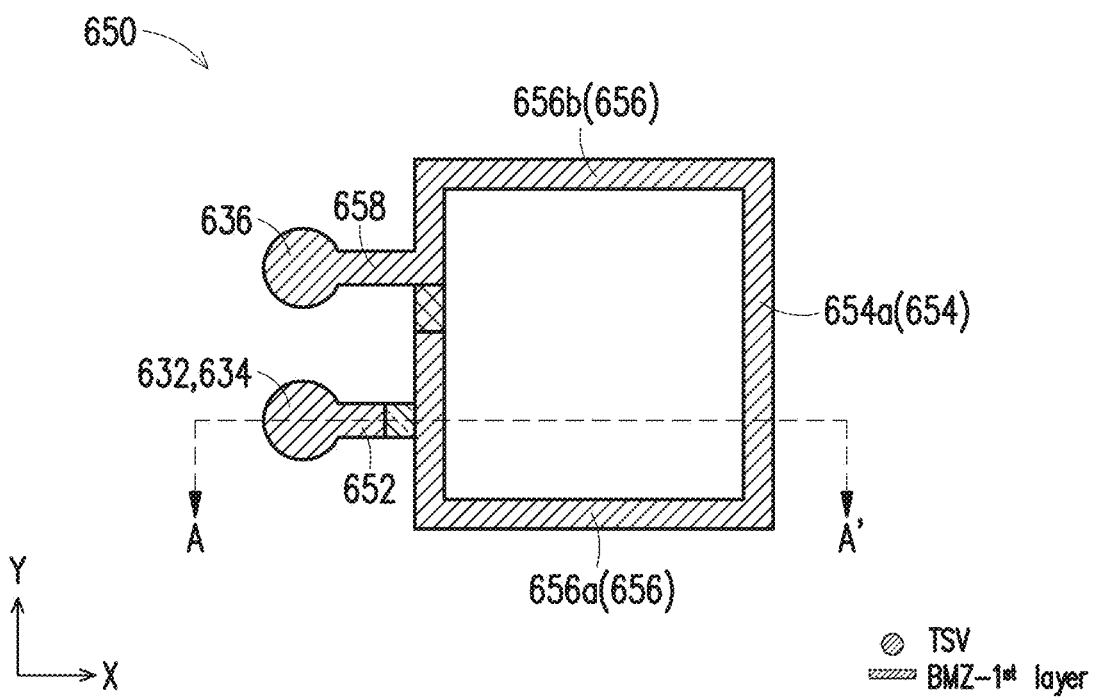
FIG. 6B is a top view of an inductor portion of an integrated circuit, in accordance with some embodiments.
Figure 6C:
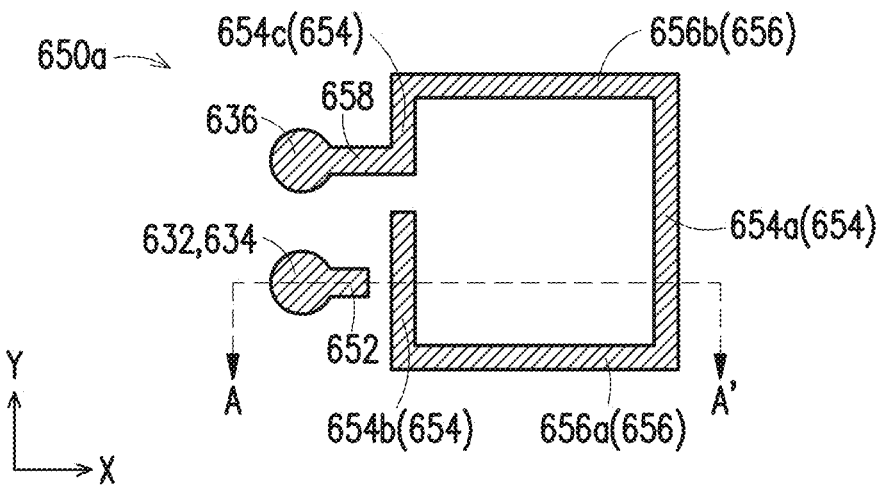
FIG. 6C is a top view of a portion of an inductor, in accordance with some embodiments.
Figure 6D:
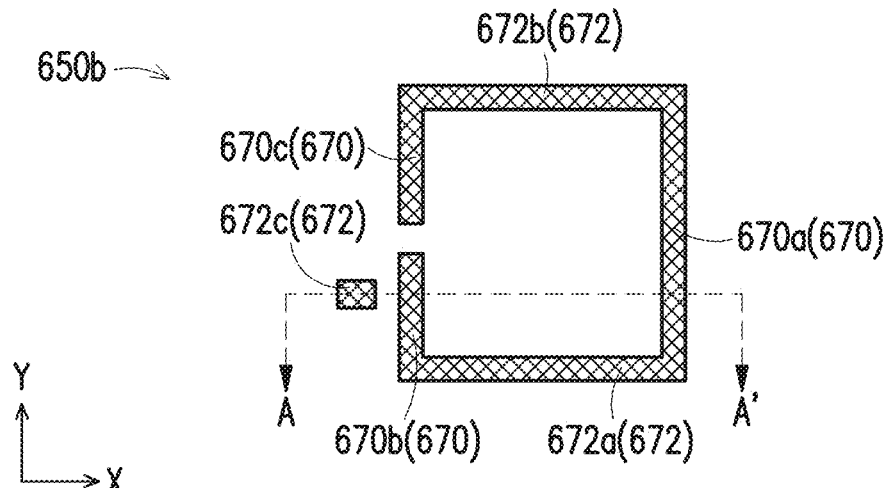
FIG. 6D is a top view of a portion of an inductor, in accordance with some embodiments.
Figure 6E:
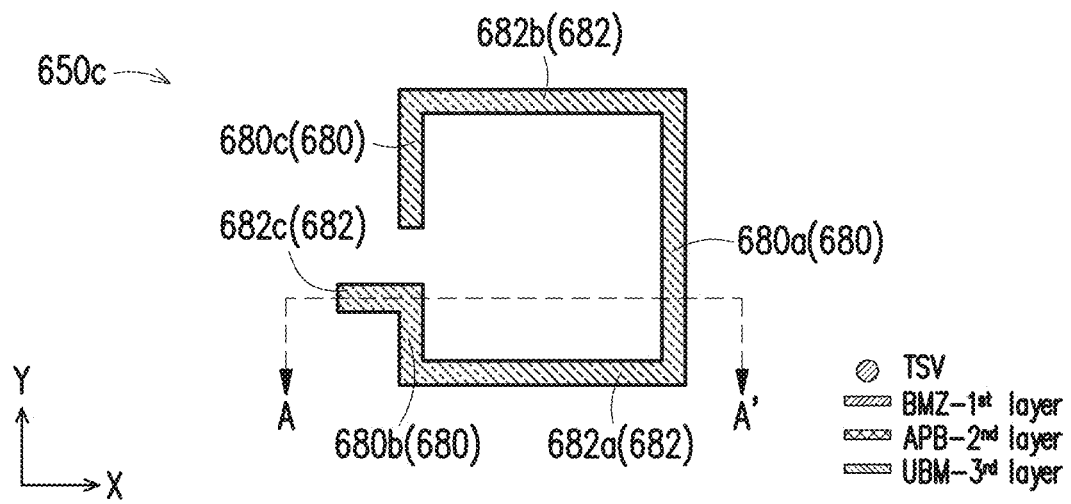
FIG. 6E is a top view of a portion of an inductor, in accordance with some embodiments.

FIGS. 6A and 6B are diagrams of at least a portion of an integrated circuit 600, in accordance with some embodiments. FIG. 6A is a cross-sectional view of integrated circuit 600 as intersected by plane A-A', and FIG. 6B is a top view of an inductor portion of integrated circuit 600, in accordance with some embodiments. For example, FIG. 6B is a top view of inductor 650 of integrated circuit 600, in accordance with some embodiments. FIG. 6C is a top view of a portion 650a of inductor 650, FIG. 6D is a top view of a portion 650b of inductor 650 and FIG. 6E is a top view of a portion 650c of inductor 650, in accordance with some embodiments.

Integrated circuit 600 is a variation of integrated circuit 100 (FIGS. 1A-1C). For example, integrated circuit 600 includes an inductor 650 rather than inductor 150 of integrated circuit 100 of FIGS. 1A-1B. In some embodiments, inductor 650 is a spiral inductor having a single turn or loop.

In comparison with integrated circuit 100 of FIGS. 1A-1B, TSV 632 of integrated circuit 600 replaces TSV 132, and inductor 650 of integrated circuit 600 replaces inductor 150. Inductor 650 is a variation of inductor 150 of FIGS. 1A-1B, and similar detailed description is therefore omitted. TSV 632 is similar to TSV 132 of FIGS. 1A-1B, and similar detailed description is therefore omitted.

Although FIG. 6A shows a single TSV (e.g., TSV 632), more than one TSV may be formed to pass through semiconductor wafer 102 in FIGS. 6A-7A. In some embodiments, interconnect structure 110 is electrically connected to semiconductor wafer 102 by TSV 632. In some embodiments, inductor 650 is electrically connected by TSV 632 to more than device 130 (e.g., device 131 as shown in FIG. 1A).

Inductor 650 and inductor 750 (FIGS. 7A-7B) is a spiral inductor having a single turn or loop. In some embodiments, inductor 650 or 750 is a spiral inductor having an air core. In some embodiments, inductor 650 or 750 is formed of one or more conductive features of one or more RDLs on the first layer and the second layer of interconnect structure 110, and one or more conductive features of the UBM on the third layer of interconnect structure 110. In some embodiments, other types of inductors are within the contemplated scope of the present disclosure. In some embodiments, inductor 650 or 750 has an integer number of turns. In some embodiments, other number of turns for inductor 650 or 750 are within the contemplated scope of the present disclosure.

In some embodiments, inductor 650 or 750 is a separate structure from interconnect structure 110, and is therefore not part of interconnect structure 110. In some embodiments, inductor 650 includes conductive portions on the first layer, the second layer and the third layer (e.g., the UBM layer) of interconnect structure 110.

Inductor 650 includes a first terminal 634, a second terminal 636, a conductive portion 652, a conductive portion 658, a set of conductive portions 654, a set of conductive portions 656, a set of conductive portions 670, a set of conductive portions 672, a set of conductive portions 680, a set of conductive portions 682, a set of vias 660 and a set of vias 662.

First terminal 634 is similar to first terminal 134 of FIGS. 1A-1B, second terminal 636 is similar to second terminal 136 of FIGS. 1A-1B, conductive portion 652 is similar to conductive portion 152 of FIGS. 1A-1B, conductive portion 658 is similar to conductive portion 158 of FIGS. 1A-1B and similar detailed descriptions are therefore omitted.

In some embodiments, first terminal 634 is an input terminal of inductor 650 and second terminal 636 is an output terminal of inductor 650. In some embodiments, first terminal 634 is the output terminal of inductor 650 and second terminal 636 is the input terminal of inductor 650. In some embodiments, the first terminal 634 is electrically coupled to TSV 632. In some embodiments, the second terminal 636 is electrically coupled to another TSV (not shown). In some embodiments, the first terminal 634 corresponds to a bottom portion of TSV 632. In some embodiments, the second terminal 636 corresponds to a bottom portion of another TSV (not shown). In some embodiments, first terminal 634 is electrically coupled to conductive portion 652. In some embodiments, second terminal 636 is electrically coupled to conductive portion 658. In some embodiments, first terminal 634 or second terminal 636 is a conductive portion. In some embodiments, other numbers of terminals of are within the contemplated scope of the present disclosure.

In some embodiments, inductor 650 is divided into portions based on the layer of interconnect structure 110. For example, inductor 650 includes an inductor portion 650a (shown in FIG. 6C) on the first layer of interconnect structure 110, an inductor portion 650b (shown in FIG. 6D) on the second layer of interconnect structure 110, and an inductor portion 650c (shown in FIG. 6E) on the third layer of interconnect structure 110.

In some embodiments, first terminal 634, second terminal 636, conductive portion 652, set of conductive portions 654, set of conductive portions 656 and conductive portion 658 are part of inductor portion 650a (shown in FIG. 6C) on the first layer of interconnect structure 110.

The set of conductive portions 654 includes one or more of conductive portions 654a, 654b and 654c. At least one conductive portion of the set of conductive portions 654 is on the first layer of interconnect structure 110. In some embodiments, at least one conductive portion of the set of conductive portions 654 extends in the second direction Y. In some embodiments, at least one conductive portion of the set of conductive portions 654 extends in the first direction X.

At least one of conductive portion 654a, 654b or 654c extends in the second direction Y. Each conductive portion of the set of conductive portions 654 is separated from another conductive portion of the set of conductive portions 654 in at least the first direction X or the second direction Y by insulating material 140.

Conductive portion 654a is separated from conductive portion 654b or 654c in the first direction X. Conductive portion 654b is separated from conductive portion 654c in the second direction Y. Conductive portion 654b is separated from conductive portion 652 in the first direction X. Other configurations, arrangements and materials of set of conductive portions 654 are within the contemplated scope of the present disclosure.

The set of conductive portions 656 includes one or more of conductive portions 656a and 656b. At least one conductive portion of the set of conductive portions 656 is on the first layer of interconnect structure 110. In some embodiments, at least one conductive portion of the set of conductive portions 656 extends in the first direction X. In some embodiments, at least one conductive portion of the set of conductive portions 656 extends in the second direction Y.

At least one of conductive portion 656a or 656b extends in the first direction X. Each conductive portion of the set of conductive portions 656 is separated from another conductive portion of the set of conductive portions 656 in the second direction Y by insulating material 140. Conductive portion 656a is separated from conductive portion 656b in the second direction Y.

Conductive portion 654b is electrically coupled to conductive portion 656a. Conductive portion 656a is electrically coupled to conductive portion 654a. Conductive portion 654a is electrically coupled to conductive portion 656b. Conductive portion 656b is electrically coupled to conductive portion 654c. Conductive portion 654c is electrically coupled to conductive portion 658. Conductive portion 658 is electrically coupled to second terminal 636. In some embodiments, at least two of the set of conductive portions 654, the set of conductive portions 656 or conductive portion 658 are an integral structure. Other configurations, arrangements and materials of set of conductive portions 656 are within the contemplated scope of the present disclosure.

In some embodiments, set of conductive portions 670 and set of conductive portions 672 are part of inductor portion 650b (shown in FIG. 6D) on the second layer of interconnect structure 110 of FIG. 6A.

The set of conductive portions 670 includes one or more of conductive portions 670a, 670b and 670c. At least one conductive portion of the set of conductive portions 670 is on the second layer of interconnect structure 110. In some embodiments, at least one conductive portion of the set of conductive portions 670 extends in the second direction Y. In some embodiments, at least one conductive portion of the set of conductive portions 670 extends in the first direction X.

At least one of conductive portion 670a, 670b or 670c extends in the second direction Y. Each conductive portion of the set of conductive portions 670 is separated from another conductive portion of the set of conductive portions 670 in at least the first direction X or the second direction Y by insulating material 140.

Conductive portion 670a is separated from conductive portion 670b or 670c in the first direction X. Conductive portion 670b is separated from conductive portion 670c in the second direction Y. Other configurations, arrangements and materials of set of conductive portions 670 are within the contemplated scope of the present disclosure.

The set of conductive portions 672 includes one or more of conductive portions 672a, 672b and 672c. At least one conductive portion of the set of conductive portions 672 is on the second layer of interconnect structure 110. In some embodiments, at least one conductive portion of the set of conductive portions 672 extends in the first direction X. In some embodiments, at least one conductive portion of the set of conductive portions 672 extends in the second direction Y.

At least one of conductive portion 672a, 672b or 672c extends in the first direction X. In some embodiments, each conductive portion of the set of conductive portions 672 is separated from another conductive portion of the set of conductive portions 672 in the first direction X or the second direction Y by insulating material 140. Conductive portion 672a is separated from conductive portion 672b in the second direction Y. Conductive portion 672c is separated from conductive portion 672a and 672b in the first direction X and the second direction Y. Conductive portion 672c is separated from conductive portion 670b in the first direction X.

Conductive portion 670b is electrically coupled to conductive portion 672a. Conductive portion 672a is electrically coupled to conductive portion 670a. Conductive portion 670a is electrically coupled to conductive portion 672b. Conductive portion 672b is electrically coupled to conductive portion 670c. In some embodiments, conductive portions 670a, 670b and 670c of the set of conductive portions 670 and conductive portions 672a and 672b of the set of conductive portions 672 are an integral structure. Other configurations, arrangements and materials of set of conductive portions 672 are within the contemplated scope of the present disclosure.

Set of vias 660 is on the first via layer of interconnect structure 110. In some embodiments, the first via layer of interconnect structure 110 is between the first layer and the second layer of interconnect structure 110. Set of vias 660 includes a via 660a. Set of vias 660 is between the set of conductive portions 654 or 656 (on the first layer of interconnect structure 110) and the set of conductive portions 670 or 672 (on the second layer of interconnect structure 110).

Set of vias 660 is below the set of conductive portions 654 and 656. Set of vias 660 is above the set of conductive portions 670 and 672.

The set of vias 660 electrically couples the set of conductive portions 654 or 656 to the set of conductive portions 670 or 672. Via 660a of the set of vias 660 electrically couples an end of conductive portion 652 to conductive portion 672c. In some embodiments, the set of vias 660 includes vias (not shown) other than via 660a which electrically couple the set of conductive portions 654 and 656 to the set of conductive portions 670 and 672. Other configurations, arrangements and materials of set of vias 660 are within the contemplated scope of the present disclosure.

In some embodiments, set of conductive portions 680 and set of conductive portions 682 are part of inductor portion 650c (shown in FIG. 6E) on the third layer of interconnect structure 110 of FIG. 6A.

The set of conductive portions 680 includes one or more of conductive portions 680a, 680b and 680c. At least one conductive portion of the set of conductive portions 680 is on the third layer of interconnect structure 110. In some embodiments, at least one conductive portion of the set of conductive portions 680 extends in the second direction Y. In some embodiments, at least one conductive portion of the set of conductive portions 680 extends in the first direction X.

At least one of conductive portion 680a, 680b or 680c extends in the second direction Y. Each conductive portion of the set of conductive portions 680 is separated from another conductive portion of the set of conductive portions 680 in at least the first direction X or the second direction Y by insulating material 140.

Conductive portion 680a is separated from conductive portion 680b or 680c in the first direction X. Conductive portion 680b is separated from conductive portion 680c in the second direction Y. Other configurations, arrangements and materials of set of conductive portions 680 are within the contemplated scope of the present disclosure.

The set of conductive portions 682 includes one or more of conductive portions 682a, 682b and 682c. At least one conductive portion of the set of conductive portions 682 is on the third layer of interconnect structure 110. In some embodiments, at least one conductive portion of the set of conductive portions 682 extends in the first direction X. In some embodiments, at least one conductive portion of the set of conductive portions 682 extends in the second direction Y.

At least one of conductive portion 682a, 682b or 682c extends in the first direction X. In some embodiments, each conductive portion of the set of conductive portions 682 is separated from another conductive portion of the set of conductive portions 682 in the first direction X or the second direction Y by insulating material 140. Conductive portion 682a is separated from conductive portion 682b in the second direction Y. Conductive portion 682c is separated from conductive portion 682b in the second direction Y.

Conductive portion 682c is electrically coupled to conductive portion 680b. Conductive portion 680b is electrically coupled to conductive portion 682a. Conductive portion 682a is electrically coupled to conductive portion 680a. Conductive portion 680a is electrically coupled to conductive portion 682b. Conductive portion 682b is electrically coupled to conductive portion 680c. In some embodiments, the set of conductive portions 680 and the set of conductive portions 682 are an integral structure. Other configurations, arrangements and materials of set of conductive portions 682 are within the contemplated scope of the present disclosure.

In some embodiments, one or more conductive portions of the set of conductive portions 680 or 682 is on the surface of interconnect structure 110 of FIG. 6A. In some embodiments, one or more conductive portions of the set of conductive portions 680 or 682 is a part of the UBM layer 112 of FIG. 6A. In some embodiments, one or more conductive portions of the set of conductive portions 680 or 682 is formed of the same material as the UBM layer 112 of FIG. 6A or formed with the UBM layer 112. Other configurations, arrangements and materials of set of conductive portions 680 or 682 are within the contemplated scope of the present disclosure.

Set of vias 662 is on the second via layer of interconnect structure 110. In some embodiments, the second via layer of interconnect structure 110 is between the second layer and the third layer of interconnect structure 110. Set of vias 662 includes a via 662*a*. Set of vias 662 is between the set of conductive portions 670 or 672 (on the second layer of interconnect structure 110) and the set of conductive portions 680 or 682 (on the third layer of interconnect structure 110). Set of vias 662 is below the set of conductive portions 670 and 672. Set of vias 662 is above the set of conductive portions 680 and 682.

The set of vias 662 electrically couples the set of conductive portions 670 or 672 to the set of conductive portions 680 or 682. Via 662*a* of the set of vias 662 electrically couples conductive portion 672*c* to conductive portion 682*c*. In some embodiments, the set of vias 662 includes vias (not shown) other than via 662*a* which electrically couple the set of conductive portions 670 and 672 to the set of conductive portions 680 and 682. Other configurations, arrangements and materials of set of vias 662 are within the contemplated scope of the present disclosure.

In some embodiments, at least one conductive portion of the set of conductive portions 654 or 656 overlaps at least one conductive portion of the set of conductive portions 670, 672, 680 or 682.

In some embodiments, at least one conductive portion of the set of conductive portions 670 or 672 overlaps at least one conductive portion of the set of conductive portions 680 or 682.

In some embodiments, conductive portion 652 overlaps conductive portion 672*c*. In some embodiments, conductive portion 658 overlaps conductive portions 670*c* and 680*c*.

In some embodiments, at least one side of conductive portion 654*a*, 654*b* or 654*c* of the set of conductive portions 654 is aligned in the first direction X or the second direction Y with at least one corresponding side of conductive portion 670*a*, 670*b* or 670*c* of the set of conductive portions 670 or one corresponding side of conductive portion 680*a*, 680*b* or 680*c* of the set of conductive portions 680.

In some embodiments, at least one side of conductive portion 656*a* or 656*b* of the set of conductive portions 656 is aligned in the first direction X or the second direction Y with at least one corresponding side of conductive portion 672*a* or 672*b* of the set of conductive portions 672 or one corresponding side of conductive portion 682*a* or 682*b* of the set of conductive portions 682.

In some embodiments, at least one side of conductive portion 670*a*, 670*b* or 670*c* of the set of conductive portions 670 is aligned in the first direction X or the second direction Y with at least one corresponding side of conductive portion 680*a*, 680*b* or 680*c* of the set of conductive portions 680.

In some embodiments, at least one side of conductive portion 672*a*, 672*b* or 672*c* of the set of conductive portions 672 is aligned in the first direction X or the second direction Y with at least one corresponding side of conductive portion 682*a*, 682*b* or 682*c* of the set of conductive portions 682.

In some embodiments, at least one side of conductive portion 652 is aligned in the first direction X or the second direction Y with at least one side of conductive portion 672*c* or at least one side of conductive portion 682*c*.

Other configurations, arrangements and materials of inductor 650 are within the contemplated scope of the present disclosure.

Figure 7A:
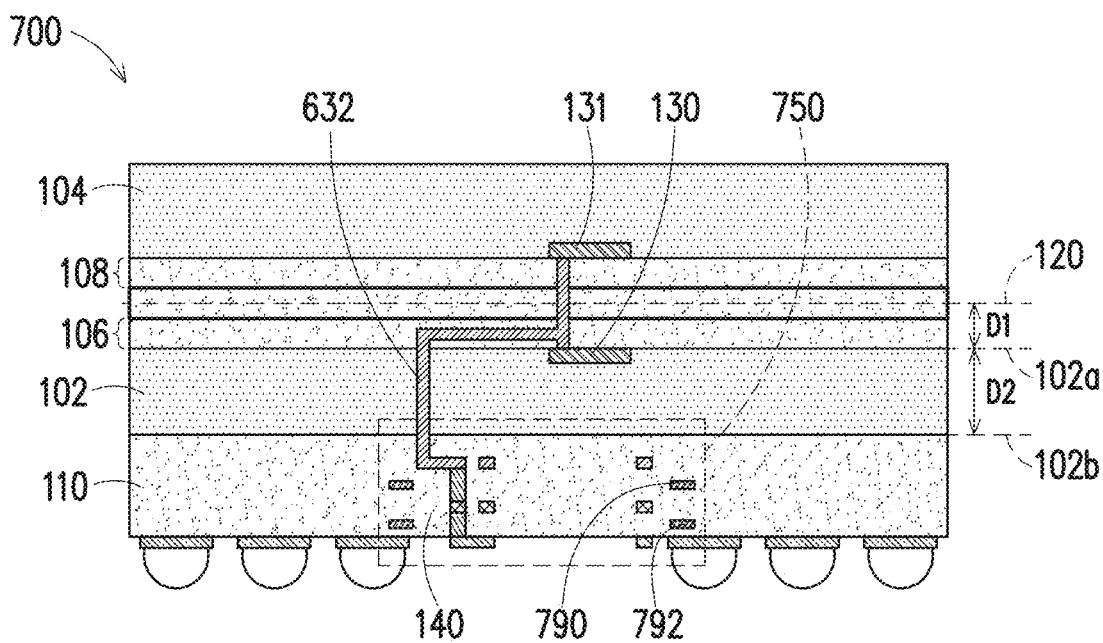
FIG. 7A is a cross-sectional view of an integrated circuit, in accordance with some embodiments.
Figure 7B:
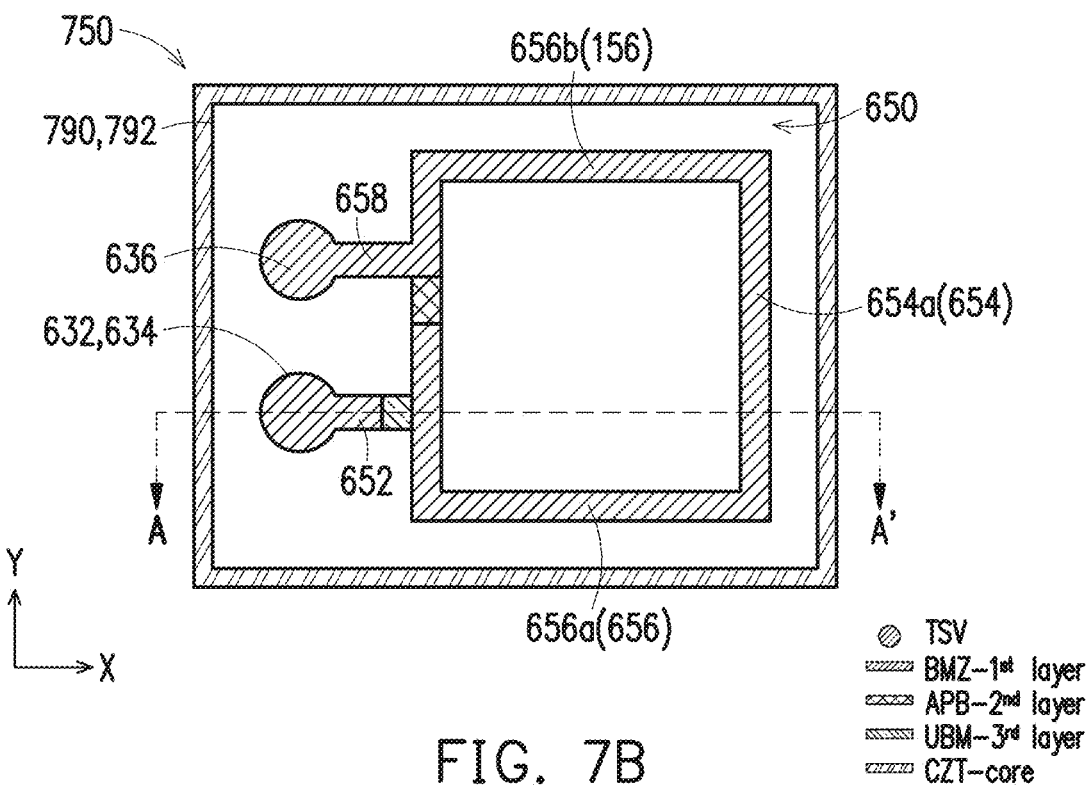
FIG. 7B is a top view of an inductor portion of an integrated circuit, in accordance with some embodiments.

FIGS. 7A and 7B are diagrams of at least a portion of an integrated circuit 700, in accordance with some embodiments. FIG. 7A is a cross-sectional view of integrated circuit 700 as intersected by plane A-A', and FIG. 7B is a top view of an inductor portion of integrated circuit 700, in accordance with some embodiments. For example, FIG. 7B is a top view of inductor 750 of integrated circuit 700, in accordance with some embodiments.

Integrated circuit 700 is a variation of integrated circuit 600 (FIGS. 6A-6B). In comparison with integrated circuit 600 of FIGS. 6A-6B, integrated circuit 700 further includes a core 790 and a core 792. In some embodiments, inductor 750 of integrated circuit 700 is a solenoid with a single turn.

Core 790 or core 792 is similar to core 590 of FIGS. 5A-5B, and similar detailed description is therefore omitted.

Core 790 and core 792 are ferromagnetic materials for inductor 750. In some embodiments, at least core 790 or core 792 is a ferrite material for inductor 750. In some embodiments, at least core 790 or core 792 includes one or more ferrite portions. Core 790 and core 792 is embedded in insulating material 140. In some embodiments, at least core 790 or core 792 is a single layer. In some embodiments, at least core 790 or core 792 includes multiple layers. In some embodiments, at least core 790 or core 792 surrounds inductor 750. In some embodiments, at least core 790 or core 792 partially encloses inductor 750. In some embodiments, at least core 790 or core 792 is part of interconnect structure 110. In some embodiments, inductor 750 is a separate structure from interconnect structure 110, and is therefore not part of interconnect structure 110. In some embodiments, at least core 790 or core 792 is a single core. In some embodiments, at least core 790 or core 792 is multiple cores.

Core 790 is between the first layer of interconnect structure 110 and the second layer of interconnect structure 110. In some embodiments, core 790 is on the first via layer of interconnect structure 110. In some embodiments, core 790 can be positioned on other layers of interconnect structure 110. In some embodiments, core 790 is between the second layer of interconnect structure 110 and the third layer of interconnect structure 110. In some embodiments, core 790 is above the first layer of interconnect structure 110. In some embodiments, core 790 is below the second layer or the third layer of interconnect structure 110.

Core 792 is between the second layer of interconnect structure 110 and the third layer of interconnect structure 110. In some embodiments, core 792 is on the second via layer of interconnect structure 110. In some embodiments, core 792 can be positioned on other layers of interconnect structure 110. In some embodiments, core 792 is between the first layer of interconnect structure 110 and the second layer of interconnect structure 110. In some embodiments, core 792 is above the first layer of interconnect structure 110. In some embodiments, core 792 is below the third layer of interconnect structure 110. In some embodiments, at least core 790 or 792 is on the first layer, the second layer or the third layer of interconnect structure 110.

In some embodiments, at least core 790 or core 792 is rectangular or the like. In some embodiments, at least core 790 or core 792 is circular or the like. In some embodiments, at least core 790 or core 792 is a polygon or the like. In some embodiments, at least core 790 or core 792 has a ring shape. In some embodiments, at least core 790 or core 792 is a closed ring. In some embodiments, at least core 790 or core 792 is a partially open ring. In some embodiments, at least core 790 or core 792 includes a single ring. In some embodiments, at least core 790 or core 792 includes multiple rings.

In some embodiments, at least core 790 or core 792 includes a ferrite material or other similar materials. In some embodiments, the ferrite material includes one or more of Cobalt, Zirconium or Tantalum (CZT). In some embodiments, the ferrite material includes Co, Zr, Ta, CoZr, Nb, Re, Nd, Pr, Ni, Dy, $Ni_8OFe_2O$, $Ni_5OFe_5O$, CoFeCu, NiFeMo, NiZn, other polymer ferrite materials, or combinations thereof.

Integrated circuit 700 of FIGS. 7A-7B can be modified to include a single core. For example, in some embodiments, integrated circuit 700 of FIGS. 7A-7B does not include core 790 or 792 resulting in a single core inductor. Integrated circuit 700 can be modified to include other numbers of cores. Other numbers, configurations, materials and arrangements of core 790 or core 792 are within the contemplated scope of the present disclosure.

Other configurations, arrangements and materials of integrated circuit 700 are within the contemplated scope of the present disclosure.

Figure 8A:
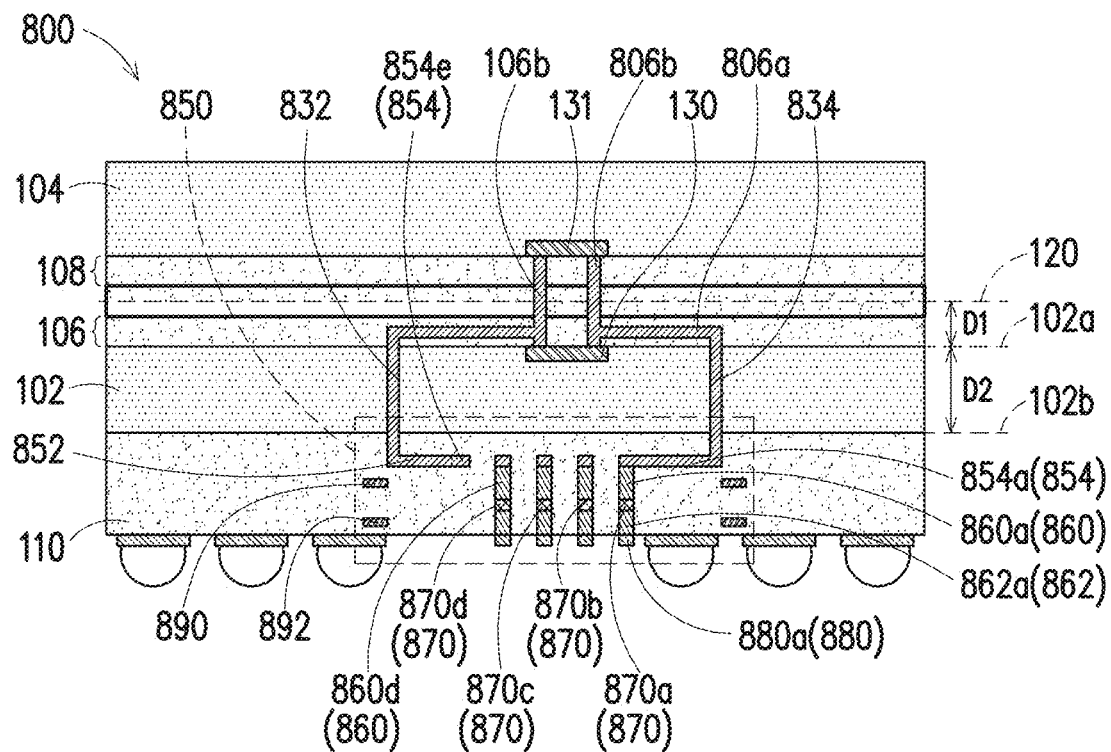
FIG. 8A is a cross-sectional view of an integrated circuit, in accordance with some embodiments.
Figure 8B:
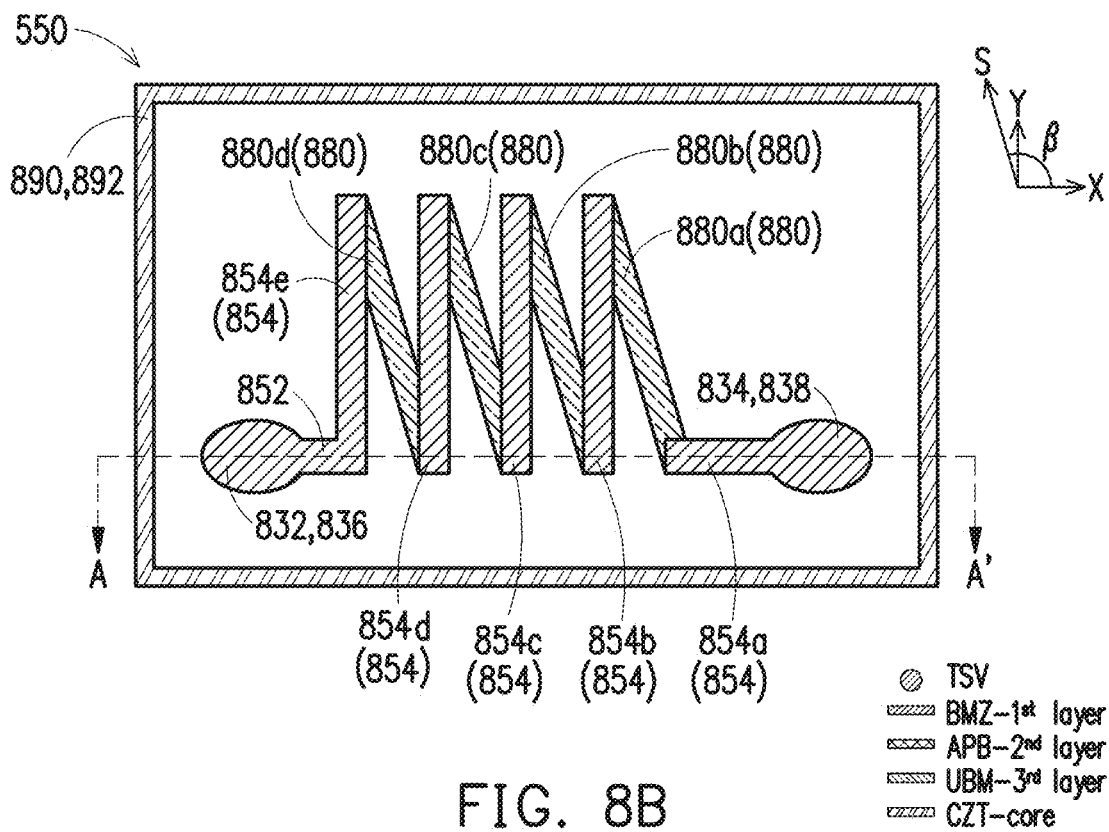
FIG. 8B is a top view of an inductor portion of an integrated circuit, in accordance with some embodiments.

FIGS. 8A and 8B are diagrams of at least a portion of an integrated circuit 800, in accordance with some embodiments. FIG. 8A is a cross-sectional view of integrated circuit 800 as intersected by plane A-A', and FIG. 8B is a top view of an inductor portion of Integrated circuit 800, in accordance with some embodiments. For example, FIG. 8B is a top view of inductor 850 of integrated circuit 800, in accordance with some embodiments.

Integrated circuit 800 is a variation of integrated circuit 100 (FIGS. 1A-1B). For example, integrated circuit 800 includes an inductor 850 rather than inductor 150 of integrated circuit 100 of FIGS. 1A-1B. In some embodiments, inductor 850 is a solenoid.

In comparison with integrated circuit 100 of FIGS. 1A-1B, TSV 832 of integrated circuit 800 replaces TSV 132, and inductor 850 of integrated circuit 800 replaces inductor 150. Inductor 850 is a variation of inductor 150 of FIGS. 1A-1B, and similar detailed description is therefore omitted. TSV 832 is similar to TSV 132 of FIGS. 1A-1B, and similar detailed description is therefore omitted. In some embodiments, inductor 850 is formed of one or more conductive features of one or more RDLs on the first layer and the second layer of interconnect 100, and one or more conductive features of the UBM on the third layer of interconnect 100.

Inductor 850, inductor 950 (FIGS. 9A-9B), inductor 1050 (FIGS. 10A-10B) and inductor 1150 (FIGS. 11A-11B) is a solenoid. In some embodiments, other types of inductors are within the contemplated scope of the present disclosure. In some embodiments, inductor 850, 950, 1050 or 1150 has an integer number of turns. In some embodiments, other number of turns for the inductor are within the contemplated scope of the present disclosure. In some embodiments, inductor 850, 950, 1050 or 1150 is a separate structure from interconnect structure 110, and is therefore not part of interconnect structure 110. In some embodiments, inductor 850, 950, 1050 or 1150 is an air core solenoid. In some embodiments, inductor 850 is a solenoid with a dual-ferromagnetic core. In some embodiments, inductor 850 includes coil portions (e.g., conductive portions) on the first layer, the second layer and the third layer (e.g., the UBM layer) of interconnect structure 110.

In comparison with integrated circuit 100 of FIGS. 1A-1B, integrated circuit 800 further includes a TSV 834, a conductive feature 806a and a conductive feature 806b. TSV 834 is similar to TSV 132 of FIGS. 1A-1B or TSV 832, and similar detailed description is therefore omitted. Conductive feature 806a and conductive feature 806b are similar to corresponding conductive feature 106a and conductive feature 106b of FIGS. 1A-1B or TSV 832, and similar detailed description is therefore omitted. Although FIG. 8A shows two TSVs (e.g., TSV 832 and TSV 834), more than two TSVs may be formed to pass through semiconductor wafer 102 in FIGS. 8A-11A. Although FIG. 8A shows two conductive features (e.g., conductive feature 806a and conductive feature 806b), more than two conductive features may be formed in integrated circuit 800 of FIG. 8A. In some embodiments, one or more of conductive feature 806a or 806b is part of interconnect structure 106 of integrated circuit 800. In some embodiments, one or more of conductive feature 806a or 806b is part of interconnect structure 108 of integrated circuit 800. In some embodiments, a portion of one or more of conductive feature 806a or 806b is part of interconnect structure 106 of integrated circuit 800. In some embodiments, a portion of one or more of conductive feature 806a or 806b is part of interconnect structure 108 of integrated circuit 800. In some embodiments, conductive structure 806a is part of TSV 834. In some embodiments, conductive structures 806a and 806b are part of the same integral structure. In some embodiments, conductive features 806a and 806b electrically couple one or more devices 130 (described below) to one or more devices 131 (described below).

In some embodiments, interconnect structure 110 of integrated circuit 800 is electrically connected to semiconductor wafer 102 via TSV 832 or TSV 834. In some embodiments, inductor 850 is electrically connected to the one or more devices 130 by TSV 832, TSV 834, conductive feature 106a, conductive feature 106b, conductive feature 806a and conductive feature 806b. In some embodiments, inductor 850 is electrically connected to the one or more devices 131 by TSV 832, TSV 834, conductive feature 106a, conductive feature 106b, conductive feature 806a and conductive feature 806b. In some embodiments, the one or more devices 130 is electrically connected to the one or more devices 131 by at least conductive feature 106b or conductive feature 806b.

Inductor 850 includes a first terminal 836, a second terminal 838, a conductive portion 852, a set of conductive portions 854, a set of conductive portions 870, a set of conductive portions 880, a set of vias 860, a set of vias 862, a core 890 and a core 892.

In some embodiments, conductive portions 854b, 854c, 854d and 854e of the set of conductive portions 854, the set of conductive portions 870 and the set of conductive portions 880 corresponds to the coil portions of inductor 850.

First terminal 836 is similar to first terminal 134 of FIGS. 1A-1B, second terminal 838 is similar to second terminal 136 of FIGS. 1A-1B, conductive portion 852 is similar to conductive portion 152 of FIGS. 1A-1B, and similar detailed descriptions are therefore omitted.

In some embodiments, first terminal 836 is an input terminal of inductor 850 and second terminal 838 is an output terminal of inductor 850. In some embodiments, first terminal 836 is the output terminal of inductor 850 and second terminal 838 is the input terminal of inductor 850. In some embodiments, the first terminal 836 is electrically coupled to TSV 832. In some embodiments, the second terminal 838 is electrically coupled to TSV 834. In some embodiments, first terminal 836 is electrically coupled to conductive portion 852. In some embodiments, the first terminal 836 corresponds to a bottom portion of TSV 832. In some embodiments, the second terminal 838 corresponds to a bottom portion of TSV 834. In some embodiments, first terminal 836 or second terminal 838 is a conductive portion. In some embodiments, other numbers of terminals of are within the contemplated scope of the present disclosure.

The set of conductive portions 854 includes one or more of conductive portions 854*a*, 854*b*, 854*c*, 854*d* and 854*e*. At least one conductive portion of the set of conductive portions 854 is on the first layer of interconnect structure 110. At least one conductive portion of the set of conductive portions 854 extends in the second direction Y. In some embodiments, at least conductive portion 854*b*, 854*c*, 854*d* or 854*e* extends in the second direction Y. At least one conductive portion of the set of conductive portions 854 extends in the first direction X. In some embodiments, conductive portion 854*a* extends in the first direction X. Each conductive portion of the set of conductive portions 854 is separated from another conductive portion of the set of conductive portions 854 in at least the first direction X or the second direction Y by insulating material 140. In some embodiments, conductive portion 854*a* of the set of conductive portions 854 is electrically coupled to second terminal 838. In some embodiments, conductive portion 854*a* of the set of conductive portions 854 and second terminal 838 are integrally formed. A first end of conductive portion 854*e* of the set of conductive portions 854 is electrically coupled to conductive portion 852. In some embodiments, conductive portion 854*e* of the set of conductive portions 854 and conductive portion 852 are integrally formed. Other configurations, arrangements and materials of set of conductive portions 854 are within the contemplated scope of the present disclosure.

The set of conductive portions 870 includes one or more of conductive portions 870*a*, 870*b*, 870*c* and 870*d*. At least one conductive portion of the set of conductive portions 870 is on the second layer of interconnect structure 110. At least one conductive portion of the set of conductive portions 870 extends in the second direction Y. In some embodiments, at least conductive portion 870*a*, 870*b*, 870*c* or 870*d* extends in the second direction Y. At least one conductive portion of the set of conductive portions 870 extends in the first direction X. In some embodiments, conductive portion 870*a* extends in the first direction X. Each conductive portion of the set of conductive portions 870 is separated from another conductive portion of the set of conductive portions 870 in at least the first direction X by insulating material 140. In some embodiments, at least one conductive portion of the set of conductive portions 854 overlaps at least one conductive portion of the set of conductive portions 870 or 880. Other configurations, arrangements and materials of set of conductive portions 870 are within the contemplated scope of the present disclosure.

Set of vias 860 is on the layer of interconnect structure 110 between the first layer and the second layer of interconnect structure 110. In some embodiments, set of vias 860 is on the first via layer of interconnect structure 110. Set of vias 860 includes one or more of vias 860*a*, 860*b*, 860*c* and 860*d*. Set of vias 860 is between the set of conductive portions 854 and the set of conductive portions 870. Set of vias 860 are below the set of conductive portions 854, and set of vias 860 are above the set of conductive portions 870. Vias 860*a*, 860*b*, 860*c* and 860*d* of the set of vias 860 electrically couple corresponding first ends of conductive portions 854*a*, 854*b*, 854*c* and 854*d* of the set of conductive portions 854 to corresponding first ends of conductive portions 870*a*, 870*b*, 870*c* and 870*d* of the set of conductive portions 870. Other configurations, arrangements and materials of set of vias 860 are within the contemplated scope of the present disclosure.

A second end of conductive portions 854*b*, 854*c*, 854*d* and 854*e* of the set of conductive portions 854 are electrically coupled to a corresponding second end of conductive portions 870*a*, 870*b*, 870*c* and 870*d* of the set of conductive portions 870 by a corresponding via (not shown) of a first set of vias (not shown).

The second end of conductive portions 854*a*, 854*b*, 854*c*, 854*d* and 854*e* of the set of conductive portions 854 are opposite from the first end of conductive portions 854*a*, 854*b*, 854*c*, 854*d* and 854*e* of the set of conductive portions 854. The second end of conductive portions 870*a*, 870*b*, 870*c* and 870*d* of the set of conductive portions 870 are opposite from the first end of conductive portions 870*a*, 870*b*, 870*c* and 870*d* of the set of conductive portions 870.

The set of conductive portions 880 includes one or more of conductive portions 880*a*, 880*b*, 880*c* and 880*d*. At least one conductive portion of the set of conductive portions 880 is on the third layer of interconnect structure 110. At least one conductive portion of the set of conductive portions 880 extends in a third direction S different from the first direction X and the second direction Y. In some embodiments, each conductive portion of the set of conductive portions 880 is separated from another conductive portion of the set of conductive portions 880 in at least the first direction X or the second direction Y by insulating material 140.

In some embodiments, one or more of set of conductive portions 880 is on the surface of interconnect structure 110. In some embodiments, one or more of set of conductive portions 880 is a part of the UBM layer 112 (as described in FIGS. 1A-1C). In some embodiments, one or more of set of conductive portions 880 is formed of the same material as the UBM layer 112 (as described in FIGS. 1A-1C) or formed with the UBM layer 112. Other configurations, arrangements and materials of set of conductive portions 880 are within the contemplated scope of the present disclosure.

Set of vias 862 is on the layer of interconnect structure 110 between the second layer and the third layer of interconnect structure 110. In some embodiments, set of vias 862 is on the second via layer of interconnect structure 110. Set of vias 862 includes one or more of vias 862*a*, 862*b*, 862*c* and 862*d*. Set of vias 862 is between the set of conductive portions 870 and the set of conductive portions 880. Set of vias 862 are below the set of conductive portions 870, and set of vias 862 are above the set of conductive portions 880. Via 862*a*, 862*b*, 862*c* and 862*d* of the set of vias 862 electrically couples corresponding first ends of conductive portions 870*a*, 870*b*, 870*c* and 870*d* of the set of conductive portions 870 to corresponding first ends of conductive portions 880*a*, 880*b*, 880*c* and 880*d* of the set of conductive portions 880. Other configurations, arrangements and materials of set of vias 862 are within the contemplated scope of the present disclosure.

A second end of conductive portions 870*a*, 870*b*, 870*c* and 870*d* of the set of conductive portions 870 are electrically coupled to a corresponding second end of conductive portions 880a, 880b, 880c and 880d of the set of conductive portions 880 by a corresponding via (not shown) of a second set of vias (not shown). The second end of conductive portions 880a, 880b, 880c and 880d of the set of conductive portions 880 are opposite from the first end of conductive portions 880a, 880b, 880c and 880d of the set of conductive portions 880.

In some embodiments, the conductive portions of the set of conductive portions 854, the conductive portions of the set of conductive portions 870 and the conductive portions of the set of conductive portions 880 are a single conductive portion.

Core 890 or core 892 is similar to core 590 of FIGS. 5A-5B, and similar detailed description is therefore omitted. Although FIG. 8A shows two cores (e.g., core 890 and core 892), other numbers of cores may be formed in interconnect structure 110 in FIGS. 8A-11A.

Core 890 and core 892 are both cores for inductor 850. Core 890 or 892 is a ferromagnetic material for inductor 850. In some embodiments, core 890 or 892 is configured to increase the magnetic field of inductor 850 thereby causing an increase in an inductance of inductor 850. In some embodiments, at least core 890 or core 892 is a ferrite material for inductor 850. In some embodiments, at least core 890 or core 892 includes one or more ferrite portions. Core 890 and core 892 is embedded in insulating material 140. In some embodiments, at least core 890 or core 892 is a single layer. In some embodiments, at least core 890 or core 892 includes multiple layers. In some embodiments, at least core 890 or core 892 surrounds inductor 850. In some embodiments, at least core 890 or core 892 partially encloses inductor 850. In some embodiments, at least core 890 or core 892 is part of interconnect structure 110. In some embodiments, at least core 890 or core 892 is a single core. In some embodiments, at least core 890 or core 892 is multiple cores.

Core 890 is between the first layer of interconnect structure 110 and the second layer of interconnect structure 110. In some embodiments, core 890 is on the first via layer of interconnect structure 110. In some embodiments, core 890 can be positioned on other layers of interconnect structure 110. In some embodiments, core 890 is between the second layer of interconnect structure 110 and the third layer of interconnect structure 110. In some embodiments, core 890 is above the first layer of interconnect structure 110. In some embodiments, core 890 is below the third layer of interconnect structure 110.

Core 892 is between the second layer of interconnect structure 110 and the third layer of interconnect structure 110. In some embodiments, core 892 is on the second via layer of interconnect structure 110. In some embodiments, core 892 can be positioned on other layers of interconnect structure 110. In some embodiments, core 892 is between the first layer of interconnect structure 110 and the second layer of interconnect structure 110. In some embodiments, core 892 is above the first layer of interconnect structure 110. In some embodiments, core 892 is below the third layer of interconnect structure 110.

In some embodiments, at least core 890 or core 892 is rectangular or the like. In some embodiments, at least core 890 or core 892 is circular or the like. In some embodiments, at least core 890 or core 892 is a polygon or the like. In some embodiments, at least core 890 or core 892 has a ring shape. In some embodiments, at least core 890 or core 892 is a closed ring. In some embodiments, at least core 890 or core 892 is a partially open ring. In some embodiments, at least core 890 or core 892 includes a single ring. In some embodiments, at least core 890 or core 892 includes multiple rings.

In some embodiments, at least core 890 or core 892 includes a ferrite material or other similar materials. In some embodiments, the ferrite material includes one or more of Cobalt, Zirconium or Tantalum (CZT). In some embodiments, the ferrite material includes Co, Zr, Ta, CoZr, Nb, Re, Nd, Pr, Ni, Dy, $Ni_8OFe_2O$, $Ni_5OFe_5O$, CoFeCu, NiFeMo, NiZn, other polymer ferrite materials, or combinations thereof. Other numbers, configurations, materials and arrangements of core 890 or core 892 are within the contemplated scope of the present disclosure.

Other configurations, arrangements and materials of inductor 850 are within the contemplated scope of the present disclosure.

Figure 9A:
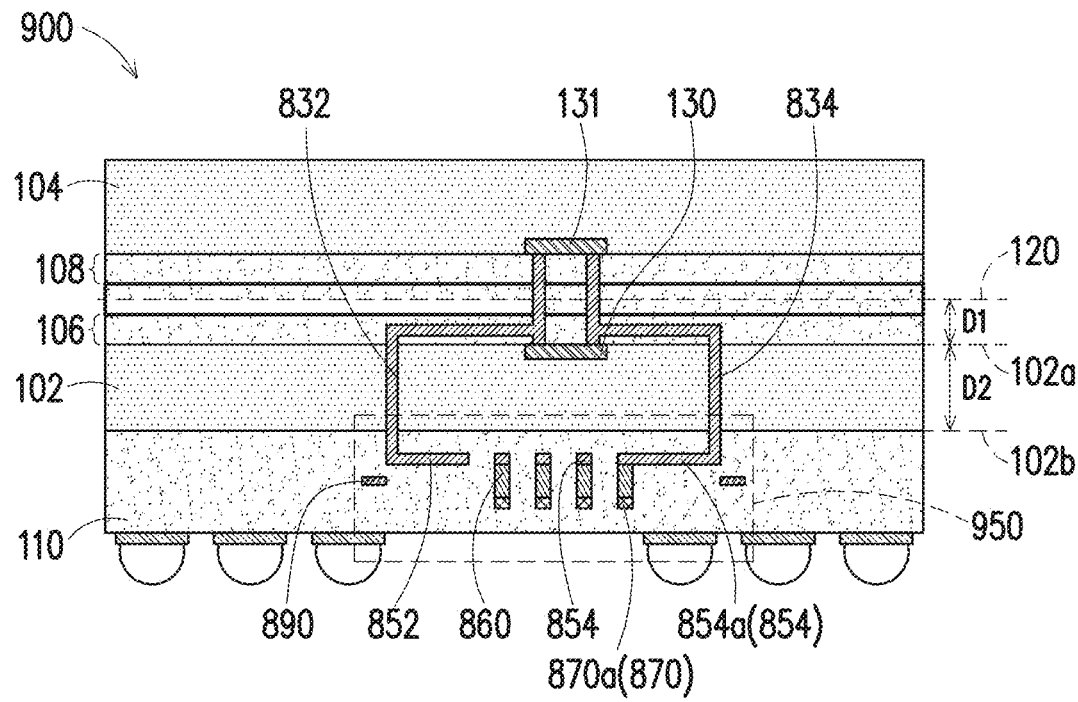
FIG. 9A is a cross-sectional view of an integrated circuit, in accordance with some embodiments.
Figure 9B:
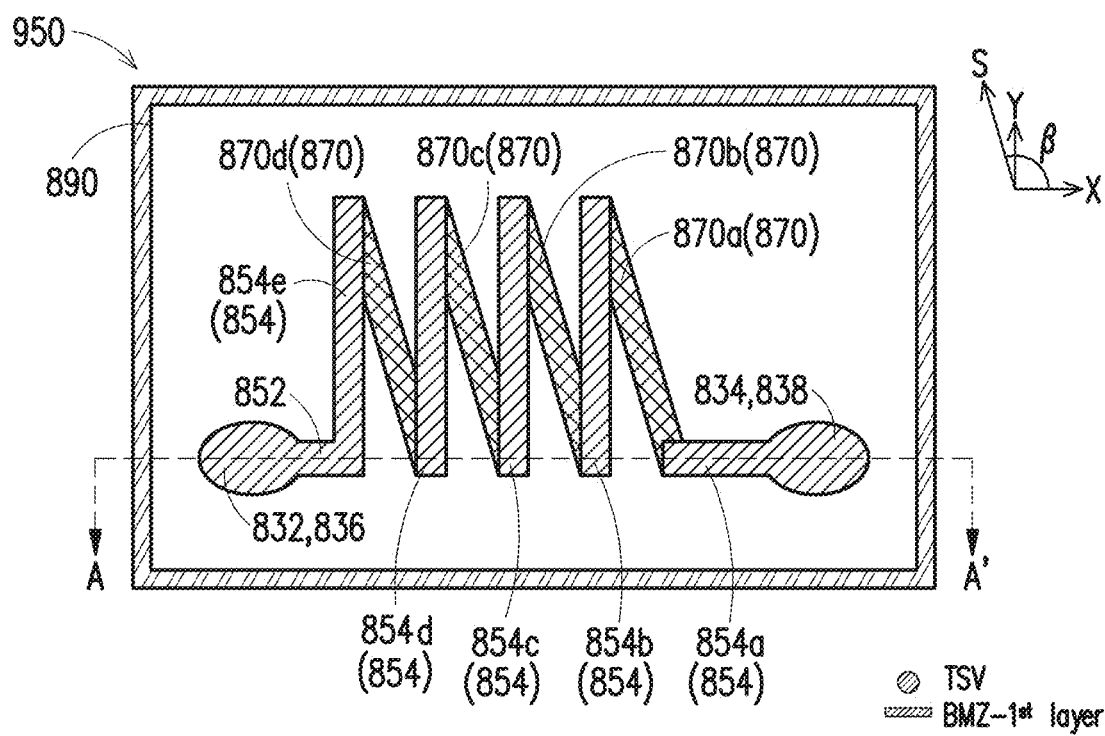
FIG. 9B is a top view of an inductor portion of an integrated circuit, in accordance with some embodiments.

FIGS. 9A and 9B are diagrams of at least a portion of an integrated circuit 900, in accordance with some embodiments. FIG. 9A is a cross-sectional view of integrated circuit 900 as intersected by plane A-A', and FIG. 9B is a top view of an inductor portion of Integrated circuit 900, in accordance with some embodiments. For example, FIG. 9B is a top view of inductor 950 of integrated circuit 900, in accordance with some embodiments.

Integrated circuit 900 is a variation of integrated circuit 800 (FIGS. 8A-8B). For example, integrated circuit 900 includes an inductor 950 rather than inductor 850 of integrated circuit 800 of FIGS. 8A-8B. In some embodiments, inductor 950 is a solenoid.

In comparison with integrated circuit 800 of FIGS. 8A-8B, inductor 950 of integrated circuit 900 replaces inductor 850. In some embodiments, inductor 950 is a solenoid having a single core, and the solenoid is positioned on the first layer, the second layer and the first via layer of interconnect structure 110.

In comparison with inductor 850 of FIGS. 8A-8B, the positioning of the set of conductive portions 870 of inductor 950 is shifted from the positioning shown in FIGS. 8A-8B. For example, each of conductive portions 870a, 870b, 870c and 870d of the set of conductive portions 870 of inductor 950 extends in the third direction S.

Inductor 950 is similar to inductor 850 of FIGS. 8A-8B, and similar detailed description is therefore omitted. In comparison with inductor 850 of FIGS. 8A-8B, inductor 950 does not include set of vias 862, set of conductive portions 880 and core 892. In some embodiments, inductor 950 is formed of one or more conductive features of one or more RDLs on the first layer and the second layer of interconnect structure 110.

In some embodiments, by not including core 892 from FIGS. 8A-8B, inductor 950 is a solenoid with a single core.

In some embodiments, by not including set of conductive portions 880 from FIGS. 8A-8B, inductor 950 does not include coil portions (e.g., conductive portions) on the third layer of interconnect structure 110 or the UBM layer.

In some embodiments, inductor 950 does not include vias between the second layer and the third layer of interconnect structure 110 (e.g., set of vias 862). Other configurations, arrangements and materials of inductor 950 are within the contemplated scope of the present disclosure.

Other configurations, arrangements and materials of integrated circuit 900 are within the contemplated scope of the present disclosure.

Figure 10A:
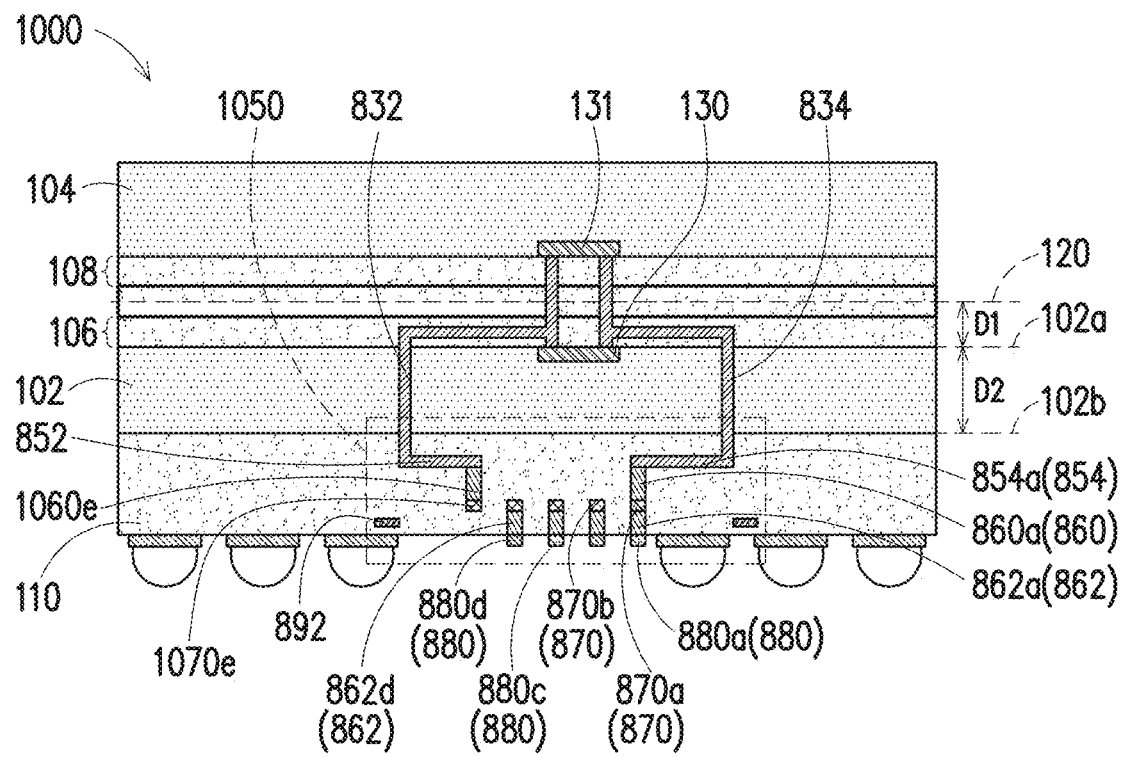
FIG. 10A is a cross-sectional view of an integrated circuit, in accordance with some embodiments.
Figure 10B:
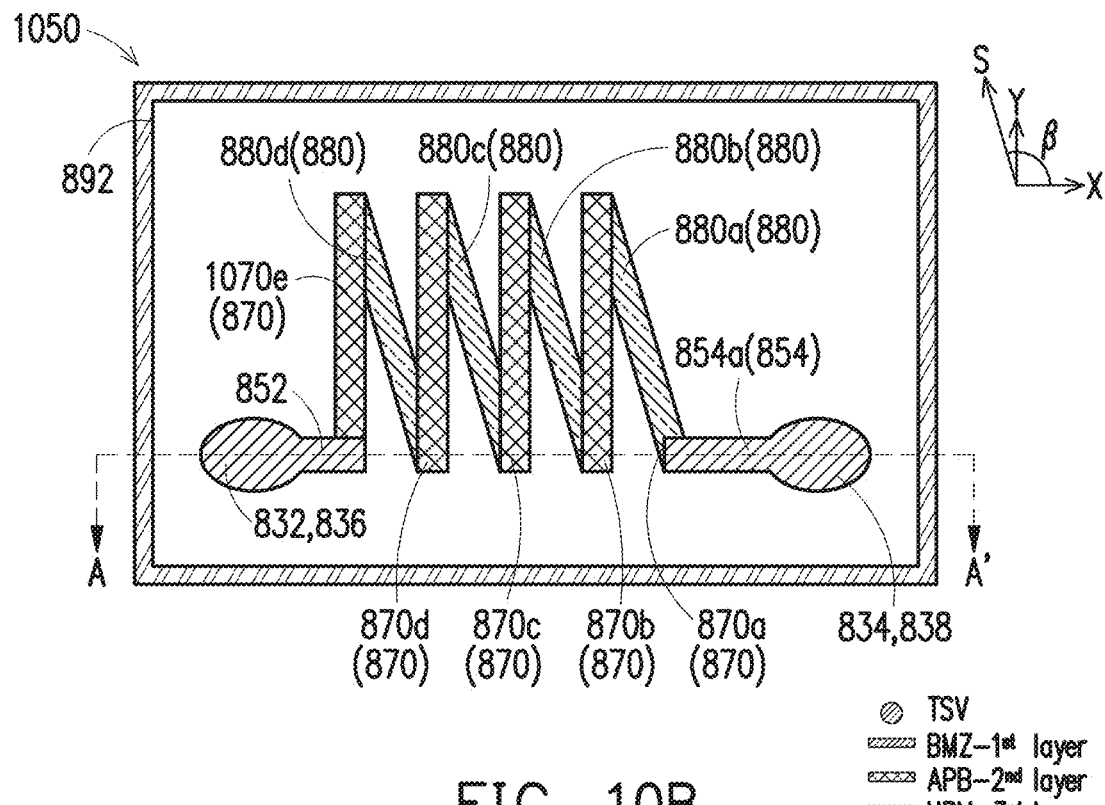
FIG. 10B is a top view of an inductor portion of an integrated circuit, in accordance with some embodiments.
Figure 11A:
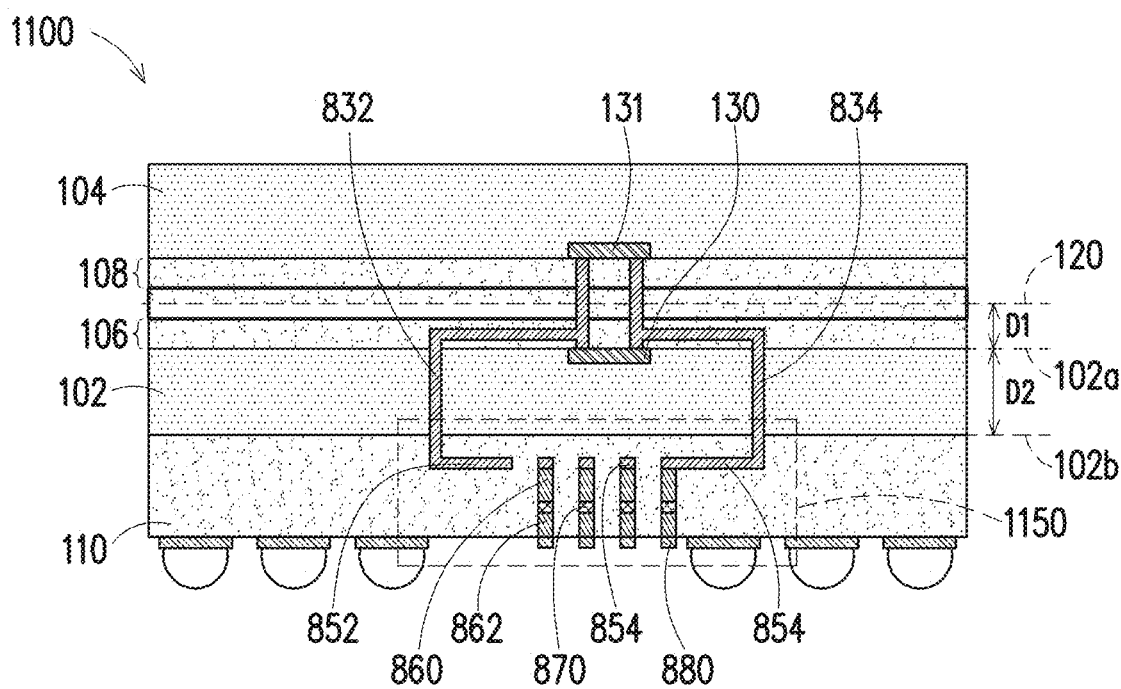
FIG. 11A is a cross-sectional view of an integrated circuit, in accordance with some embodiments.
Figure 11B:
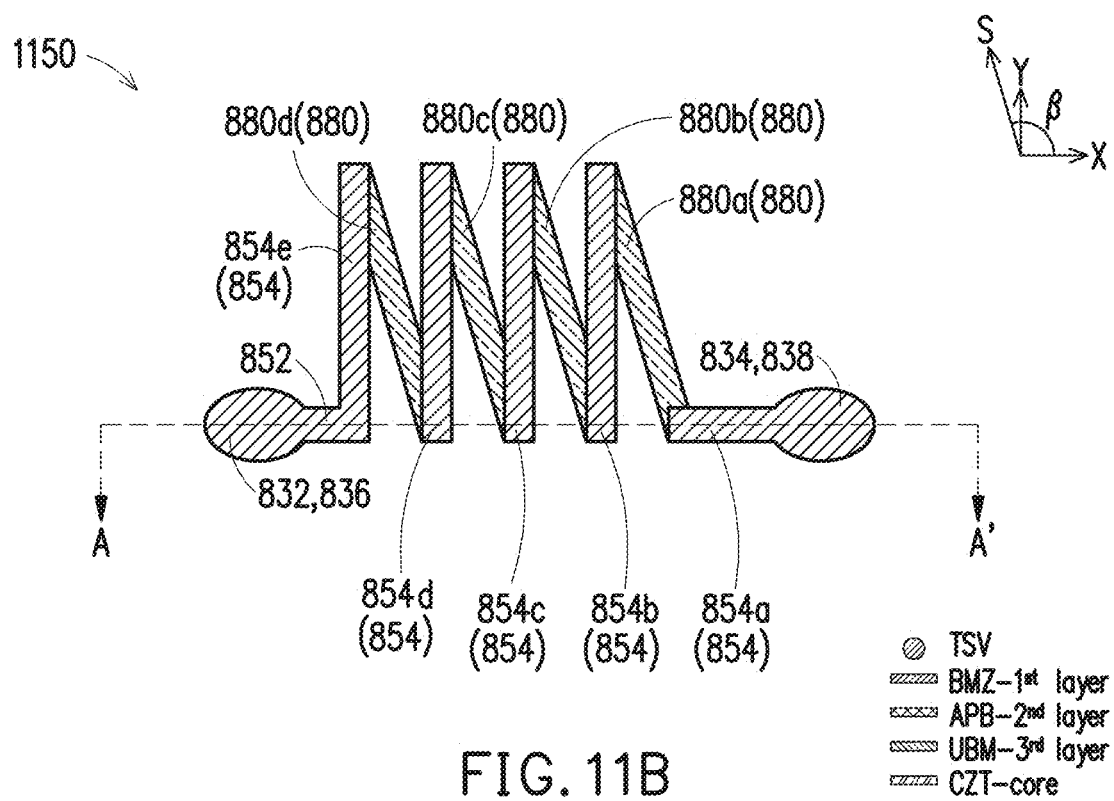
FIG. 11B is a top view of an inductor portion of an integrated circuit, in accordance with some embodiments.

FIGS. 10A and 10B are diagrams of at least a portion of an integrated circuit 1000, in accordance with some embodiments. FIG. 10A is a cross-sectional view of integrated circuit 1000 as intersected by plane A-A', and FIG. 10B is a top view of an inductor portion of Integrated circuit 1000, in accordance with some embodiments. For example, FIG. 10B is a top view of inductor 1050 of integrated circuit 1000, in accordance with some embodiments.

Integrated circuit 1000 is a variation of integrated circuit 800 (FIGS. 8A-8B). For example, integrated circuit 1000 includes an inductor 1050 rather than inductor 850 of integrated circuit 800 of FIGS. 8A-8B. In some embodiments, inductor 1050 is a solenoid.

In comparison with integrated circuit 800 of FIGS. 8A-8B, inductor 1050 of integrated circuit 1000 replaces inductor 850. In some embodiments, inductor 1050 is a solenoid having a single core, and the solenoid is positioned on at least the second layer, the third layer and the second via layer of interconnect structure 110. In some embodiments, inductor 1050 is formed of one or more conductive features of one or more RDLs on the first layer and the second layer of interconnect structure 110, and one or more conductive features of the UBM on the third layer of interconnect structure 110.

Inductor 1050 is similar to inductor 850 of FIGS. 8A-8B, and similar detailed description is therefore omitted. In comparison with inductor 850 of FIGS. 8A-8B, inductor 1050 does not include core 890, each of conductive portions 854b, 854c, 854d and 854e of the set of conductive portions 854, and each of vias 860b, 860c and 860d of the set of vias 860.

In comparison with inductor 850 of FIGS. 8A-8B, inductor 1050 further includes a via 1060e and a conductive portion 1070e.

Via 1060e and via 860a are part of the set of vias 860 of inductor 1050. Via 1060e is similar to via 860a of FIGS. 8A-8B, and similar detailed description is therefore omitted.

Conductive portion 1070e is similar to conductive portion 870a of FIGS. 8A-8B, and similar detailed description is therefore omitted. Conductive portion 1070e and conductive portions 870a, 870b, 870c and 870d are part of the set of conductive portions 870 of inductor 1050.

Conductive portion 1070e is on the second layer of interconnect structure 110. Conductive portion 1070e extends in the second direction Y. Conductive portion 1070e is electrically coupled to conductive portion 852 by via 1060e.

Via 1060e is on the layer of interconnect structure 110 between the first layer and the second layer of interconnect structure 110. In some embodiments, via 1060e is on the first via layer of interconnect structure 110. Via 1060e is between the conductive portion 852 and conductive portion 1070e.

In some embodiments, by not including core 890 from FIGS. 8A-8B, inductor 1050 is a solenoid with a single core. In some embodiments, by not including conductive portions 854b, 854c, 854d and 854e of the set of conductive portions 854 from FIGS. 8A-8B, inductor 1050 does not include coil portions (e.g., conductive portions) on the first layer of interconnect structure 110. Other configurations, arrangements and materials of inductor 1050 are within the contemplated scope of the present disclosure.

Other configurations, arrangements and materials of integrated circuit 1000 are within the contemplated scope of the present disclosure.

FIGS. 11A and 11B are diagrams of at least a portion of an integrated circuit 1100, in accordance with some embodiments. FIG. 11A is a cross-sectional view of integrated circuit 1100 as intersected by plane A-A', and FIG. 11B is a top view of an inductor portion of Integrated circuit 1100, in accordance with some embodiments. For example, FIG. 11B is a top view of inductor 1150 of integrated circuit 1100, in accordance with some embodiments.

Integrated circuit 1100 is a variation of integrated circuit 800 (FIGS. 8A-8B). In comparison with integrated circuit 800 of FIGS. 8A-8B, inductor 1150 of integrated circuit 1100 replaces inductor 850. Inductor 1150 is a variation of inductor 850 (FIGS. 8A-8B), and similar detailed description is therefore omitted. In comparison with inductor 850 of FIGS. 8A-8C, inductor 1150 of integrated circuit 1100 does not include core 890 and core 892. In some embodiments, inductor 1150 of integrated circuit 1100 is an air core inductor.

Each of integrated circuit 900 and 1000 of corresponding FIGS. 9A-9B and 10A-10B can be similarly modified as that shown for FIGS. 11A-11B. For example, in some embodiments, integrated circuit 900 of FIGS. 9A-9B can be similarly modified to not include core 890 resulting in an air core inductor. For example, in some embodiments, integrated circuit 1000 of FIGS. 10A-10B can be similarly modified to not include core 892 resulting in an air core inductor.

In some embodiments, inductor 1150 is formed of one or more conductive features of one or more RDLs on the first layer and the second layer of interconnect structure 110, and one or more conductive features of the UBM on the third layer of interconnect structure 100.

Other configurations, arrangements and materials of integrated circuit 1100 are within the contemplated scope of the present disclosure.

For brevity, in some embodiments, each of the materials for the different elements of integrated circuit 1100 is not described. In some embodiments, substituting the materials described with respect to each of the different figures (FIGS. 1A-1C, 2A-2B, 3A-3B, 4A-4B, 5A-5B, 6A-6B, 7A-7B, 8A-8B, 9A-9B, 10A-10B and 11A-11B) for similar structures in integrated circuit 1100 are within the contemplated scope of the present disclosure.

In some embodiments, inductor 250, 350, 450, 550, 650, 750, 850, 950, 1050 or 1150 is on the backside 102b of semiconductor wafer 102. In some embodiments, by positioning inductor 250, 350, 450, 550, 650, 750, 850, 950, 1050 or 1150 on the backside 102b of semiconductor wafer 102, inductor 250, 350, 450, 550, 650, 750, 850, 950, 1050 or 1150 is separated from the one or more devices 130 or 131 by at least distance D2 resulting in no keep out zone on the front side 102a of semiconductor wafer 102. In some embodiments, by not having a keep out zone on the front side 102a of semiconductor wafer 102, additional routing resources are available on the front side 102a of semiconductor wafer 102 yielding an increase in the routing area of integrated circuits 200-1100 compared with other approaches. In some embodiments, by not having a keep out zone on the front side 102a of semiconductor wafer 102, the area of the one or more devices 130 can be increased compared with other approaches. In some embodiments, by positioning inductor 250, 350, 450, 550, 650, 750, 850, 950, 1050 or 1150 on the backside 102b of semiconductor wafer 102, inductor 250, 350, 450, 550, 650, 750, 850, 950, 1050 or 1150 is separated from the one or more devices 130 by at least distance D2 resulting in less EMI between inductor 250, 350, 450, 550, 650, 750, 850, 950, 1050 or 1150 and the one or more devices 130 or 131. In some embodiments, by positioning inductor 250, 350, 450, 550, 650, 750, 850, 950, 1050 or 1150 on the backside 102b of semiconductor wafer 102, inductor 250, 350, 450, 550, 650, 750, 850, 950, 1050 or 1150 has at least a similar resistance as other approaches.

Figure 12:
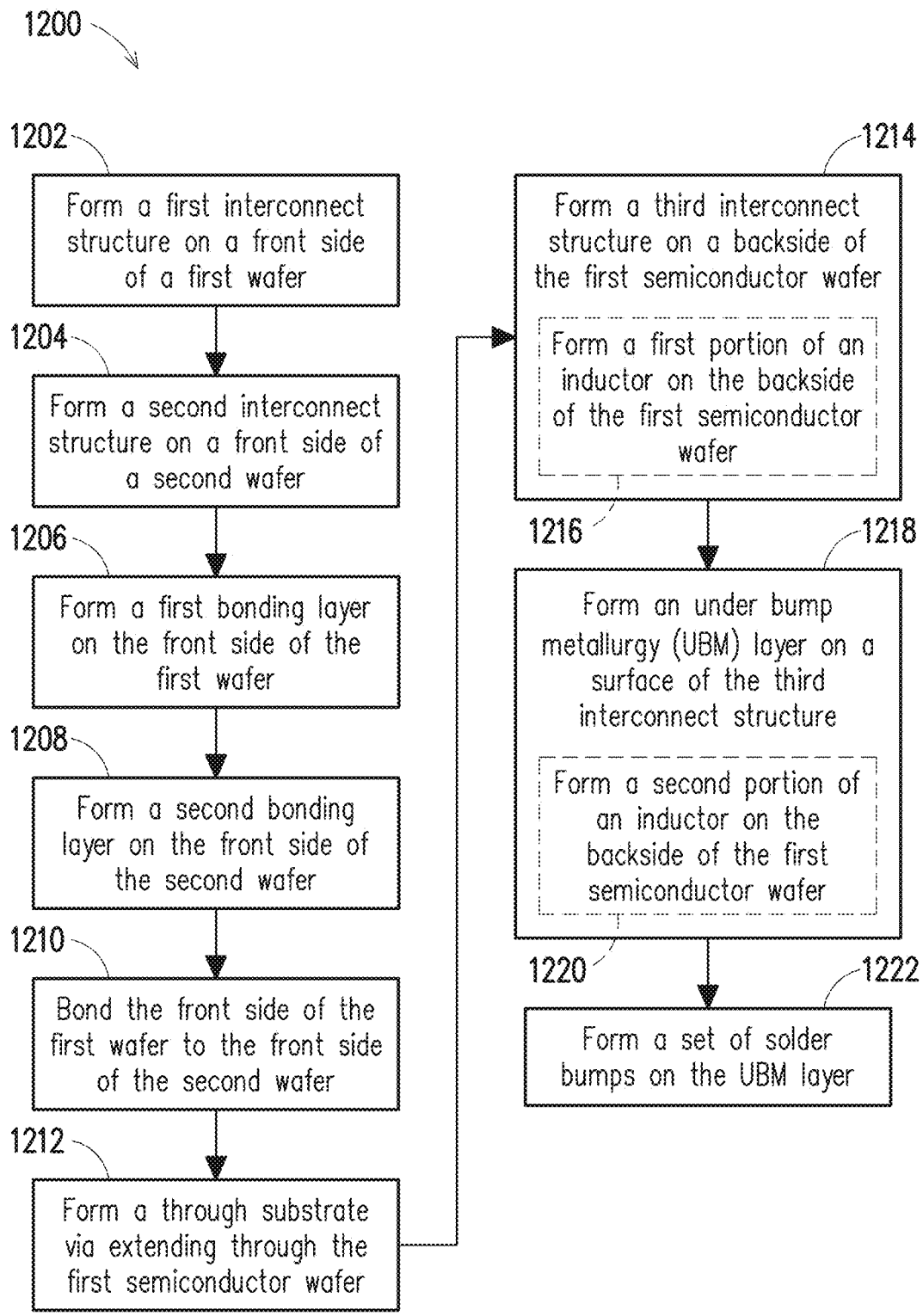
FIG. 12 is a flowchart of a method of forming an integrated circuit, in accordance with some embodiments.

FIG. 12 is a flowchart of a method 1200 of forming an integrated circuit in accordance with some embodiments. It is understood that additional operations may be performed before, during, and/or after the method 1200 depicted in FIG. 12, and that some other processes may only be briefly described herein. In some embodiments, the method 1200 is usable to form integrated circuits, such as integrated circuits 100, 200, 300, 400, 500, 600, 700, 800, 900, 1000 and 1100.

In operation 1202 of method 1200, a first interconnect structure (e.g., interconnect structure 106) is formed on a front side 102*a* of a first semiconductor wafer (e.g., semiconductor wafer 102). In some embodiments, the front side 102*a* of the first semiconductor wafer (e.g., semiconductor wafer 102) has a first device 130.

In some embodiments, the first interconnect structure (e.g., interconnect structure 106) is formed on a front side 102*a* of the first semiconductor wafer (e.g., semiconductor wafer 102) by one or more single or dual damascene processes.

In some embodiments, operation 1202 includes depositing an insulating material (e.g., similar to insulating material 140) over the front side 102*a* of the first semiconductor wafer (e.g., semiconductor wafer 102), performing one or more etching processes to form one or more openings in the insulating material 140, filling the one or more openings with one or more conductive materials, and removing the one or more conductive materials that protrude from the one or more openings.

In some embodiments, the first interconnect structure (e.g., interconnect structure 106) includes conductive features, such as conductive lines, vias, or conductive pads, formed in the insulating material 140.

Method 1200 continues with operation 1204, where a second interconnect structure (e.g., interconnect structure 108) is formed on a front side 104*a* of a second semiconductor wafer (e.g., semiconductor wafer 104). In some embodiments, the front side 104*a* of the second semiconductor wafer (e.g., semiconductor wafer 104) has a second device 131.

In some embodiments, the second interconnect structure (e.g., interconnect structure 108) is formed on a front side 104*a* of the second semiconductor wafer (e.g., semiconductor wafer 104) by one or more single or dual damascene processes.

In some embodiments, operation 1204 includes depositing an insulating material (e.g., similar to insulating material 140) over the front side 104*a* of the second semiconductor wafer (e.g., semiconductor wafer 104), performing one or more etching processes to form one or more openings in the insulating material 140, filling the one or more openings with one or more conductive materials, and removing the one or more conductive materials that protrude from the one or more openings.

In some embodiments, the second interconnect structure (e.g., interconnect structure 108) includes conductive features, such as conductive lines, vias, or conductive pads, formed in the insulating material 140.

Method 1200 continues with operation 1206, where a first bonding layer (e.g, bonding layer 122) is formed on the front side 102*a* of the first semiconductor wafer (e.g., semiconductor wafer 102). In some embodiments, bonding layer 122 is formed by plasma enhanced chemical vapor deposition (PECVD). In some other embodiments, bonding layer 122 is formed by a spin-on method.

Method 1200 continues with operation 1208, where a second bonding layer (e.g, bonding layer 124) is formed on the front side 104*a* of the second semiconductor wafer (e.g., semiconductor wafer 104). In some embodiments, bonding layer 124 is formed by PECVD. In some other embodiments, bonding layer 124 is formed by a spin-on method.

In some embodiments, before operation 1210, the first and second semiconductor wafer (e.g., semiconductor wafers 102 and 104) are bonded together, bonding layers 122 and 124 are treated.

In some embodiments, bonding layers 122 and 124 are treated by a dry treatment or a wet treatment. In some embodiments, the dry treatment includes a plasma treatment. In some embodiments, the plasma treatment is performed in an inert environment, such as an environment filled with inert gas including $N_2$, Ar, He or combinations thereof. Alternatively, other types of treatments may be used. In some embodiments, both of bonding layers 122 and 124 are made of silicon oxide, and a plasma process is performed to bonding layers 122 and 124 to form Si—OH bonds on the surface of bonding layers 122 and 124 prior to bonding.

Method 1200 continues with operation 1210, where the front side 102*a* of the first semiconductor wafer (e.g., semiconductor wafer 102) is bonded to the front side 104*a* of the second semiconductor wafer (e.g., semiconductor wafer 104). In some embodiments, the first semiconductor wafer (e.g., semiconductor wafer 102) is bonded to the second semiconductor wafer (e.g., semiconductor wafer 104) to form a 3DIC stacking structure (e.g., integrated circuit 100-1100).

In some embodiments, operation 1210 is performed under pressure and heat. In some embodiments, the pressure for bonding is in a range from about 0.7 bar to about 10 bar. In some embodiments, the heat applied to the first and second semiconductor wafers includes an anneal operation at a temperature in a range from about 20° C. to about 1000° C. In some embodiments, the bonding process is performed in an $N_2$ environment, an Ar environment, an He environment, an inert-mixing gas environment, or combinations thereof.

In some embodiments, before operation 1210, the first and second semiconductor wafer (e.g., semiconductor wafers 102 and 104) are aligned.

In some embodiments, after operation 1210, a thinning process is performed on the backside of the first semiconductor wafer (e.g., semiconductor wafer 102) or the second semiconductor wafer (e.g., semiconductor wafer 104). In some embodiments, the thinning process includes a grinding operation and a polishing operation (such as chemical mechanical polishing (CMP)). In some embodiments, after the thinning process, a wet etching operation is performed to remove defects formed on the backside of the first semiconductor wafer (e.g., semiconductor wafer 102) or the second semiconductor wafer (e.g., semiconductor wafer 104).

Method 1200 continues with operation 1212, where a through substrate via (TSV) 132 is formed extending through the first semiconductor wafer (e.g., semiconductor wafer 102). In some embodiments, the TSV of method includes at least TSV 232, 332, 432, 632, 832 or 834.

In some embodiments, operation 1212 includes forming a TSV 132 opening to extend through the first semiconductor wafer (e.g., wafer 102) by one or more etching processes. In some embodiments, after the TSV opening is formed, a liner is formed on sidewalls of the TSV 132 opening to act as an isolation layer, such that conductive materials of TSV 132 and semiconductor wafer 102 do not directly contact with each other. In some embodiments, afterwards, a diffusion barrier layer is conformally formed on the liner and on the bottom of the TSV 132 opening. In some embodiments, the diffusion barrier layer is used to prevent conductive material, which will be formed later, from migrating to device regions 130 and 131. In some embodiments, after the diffusion barrier layer is formed, conductive material is used to fill into the TSV 132 opening. In some embodiments, afterwards, excess liner, diffusion barrier layer, and conductive material, which are on the outside of the TSV opening, are removed by a planarization process, such as a chemical mechanical polishing (CMP) process, although any suitable removal process may be used.

In some embodiments, the liner is made of an insulating material, such as oxides or nitrides. In some embodiments, the liner is formed by using a plasma enhanced chemical vapor deposition (PECVD) process or other applicable processes. In some embodiments, the liner is be a single layer or multi-layers.

In some embodiments, the diffusion barrier layer is made of Ta, TaN, Ti, TiN or CoW. In some embodiments, the diffusion barrier layer is formed by a physically vapor deposition (PVD) process. In some embodiments, the diffusion barrier layer is formed by plating. In some embodiments, the conductive material is made of copper, copper alloy, aluminum, aluminum alloys, or combinations thereof. Alternatively, other applicable materials may be used.

Method 1200 continues with operation 1214, where a third interconnect structure (e.g., interconnect structure 110) is formed on a backside 102*b* of the first semiconductor wafer (e.g., semiconductor wafer 102). In some embodiments, the third interconnect structure (e.g., interconnect structure 110) is formed on a backside 102*b* of the first semiconductor wafer (e.g., semiconductor wafer 102) by one or more single or dual damascene processes.

In some embodiments, operation 1214 includes depositing an insulating material 140 over the backside 102*b* of the first semiconductor wafer (e.g., semiconductor wafer 102), performing one or more etching processes to form one or more openings in the insulating material 140, filling the one or more openings with one or more conductive materials, and removing the one or more conductive materials that protrude from the one or more openings.

In some embodiments, the third interconnect structure (e.g., interconnect structure 110) includes conductive features, such as conductive lines, vias, or conductive pads, formed in the insulating material 140.

In some embodiments, operation 1214 further includes operation 1216. In some embodiments, operation 1216 includes forming a first portion of an inductor (e.g., inductor 350) on the backside 102*b* of the first semiconductor wafer (e.g., semiconductor wafer 102).

In some embodiments, the first portion of the inductor (e.g., inductor 350) includes a first conductive portion (e.g., conductive portion 352) on a first layer of the third interconnect structure (e.g., interconnect structure 110), a second conductive portion (e.g., set of conductive portions 370) on the second layer of the third interconnect structure (e.g., interconnect structure 110) different from the first layer of the third interconnect structure (e.g., interconnect structure 110), and a first set of vias (e.g., via 360) electrically coupling the first conductive portion (e.g., conductive portion 352) to the second conductive portion (e.g., set of conductive portions 370).

In some embodiments, the first conductive portion of the first portion of the inductor (e.g., inductor 350) includes one or more of conductive portion 152, 252, 352, 452 or 170, or one or more of set of conductive portions 154, 854, 870, 270, 370 or 470.

In some embodiments, the second conductive portion of the first portion of the inductor (e.g., inductor 350) includes one or more of conductive portion 152, 252, 352, 452 or 170, or one or more of set of conductive portions 154, 854, 870, 270, 370 or 470.

In some embodiments, the first set of vias of the first portion of the inductor (e.g., inductor 350) includes one or more of vias 160, 162, 260, 460 or one or more vias of set of vias 860.

In some embodiments, the inductor of method 1200 includes one or more of inductors 150, 250, 350, 450, 550, 650, 750, 850, 950, 1050 and 1150, and detailed description of these layout patterns is therefore omitted.

Method 1200 continues with operation 1218, where an under bump metallurgy (UBM) layer 112 is formed on a surface of the third interconnect structure (e.g., interconnect structure 110).

In some embodiments, UBM layer 112 is formed on interconnect structure 110. In some embodiments, UBM layer 112 contains at least an adhesion layer or a wetting layer. In some embodiments, UBM layer 112 is made of titanium (Ti), titanium nitride (TiN), tantalum nitride (TaN), tantalum (Ta), or the like. In some embodiments, UBM layer 112 further includes a copper seed layer.

In some embodiments, operation 1218 further includes operation 1220. In some embodiments, operation 1220 includes forming a second portion of the inductor (e.g., inductor 350) on the backside 102*b* of the first semiconductor wafer (e.g., semiconductor wafer 102).

In some embodiments, the second portion of the inductor (e.g., inductor 350) includes a third conductive portion (e.g., conductive portion 380) on the surface of the third interconnect structure (e.g., interconnect structure 110), and a second set of vias (e.g., vias 362 or 364) electrically coupling the second conductive portion to the third conductive portion (e.g., conductive portion 380).

In some embodiments, the third conductive portion of the second portion of the inductor (e.g., inductor 350) includes one or more of set of conductive portions 480, 680 or 880.

In some embodiments, the second set of vias of the second portion of the inductor (e.g., inductor 350) includes one or more of vias 362, 364, 462 or one or more vias of set of vias 862.

In some embodiments, the third conductive portion of the second portion of the inductor (e.g., inductor 350) is a part of the UBM layer 112.

In some embodiments, the third conductive portion of the second portion of the inductor (e.g., inductor 350) is formed on interconnect structure 110. In some embodiments, the third conductive portion of the second portion of the inductor (e.g., inductor 350) contains at least an adhesion layer or a wetting layer. In some embodiments, the third conductive portion of the second portion of the inductor (e.g., inductor 350) is made of titanium (Ti), titanium nitride (TiN), tantalum nitride (TaN), tantalum (Ta), or the like. In some embodiments, the third conductive portion of the second portion of the inductor (e.g., inductor 350) includes a copper seed layer.

Method 1200 continues with operation 1222, where a set of solder bumps 114 is formed on the UBM layer 112. In some embodiments, set of solder bumps 114 includes a conductive element made of one or more conductive materials having low resistivity, such as solder or solder alloy. In some embodiments, set of solder bumps 114 includes a solder alloy including Sn, Pb, Ag, Cu, Ni, Bi, or combinations thereof. In some embodiments, the set of solder bumps 114 is not formed on the third conductive portion of the inductor (e.g., inductor 350).

In some embodiments, one or more of operations 1202, 1204, 1206, 1208, 1210, 1212, 1214, 1216, 1218, 1220 or 1222 of method 1200 is not performed.

One aspect of this description relates to an integrated circuit. The integrated circuit includes a first semiconductor wafer, a second semiconductor wafer, a first interconnect structure, second interconnect structure, an inductor and a through substrate via. The first semiconductor wafer has a first device in a front side of the first semiconductor wafer. The second semiconductor wafer is bonded to the first semiconductor wafer. The first interconnect structure below a backside of the first semiconductor wafer. The inductor is below the first semiconductor wafer, and at least a portion of the inductor is within the first interconnect structure. The second interconnect structure is on the front side of the first semiconductor wafer. The through substrate via extends through the first semiconductor wafer. The inductor is coupled to at least the first device by the second interconnect structure and the through substrate via. In some embodiments, the integrated circuit further includes an under bump metallurgy (UBM) layer on a surface of the first interconnect structure. In some embodiments, the integrated circuit further includes a set of solder bumps on the UBM layer. In some embodiments, the inductor includes a first conductive portion on a first layer of the first interconnect structure; a second conductive portion on a second layer of the first interconnect structure different from the first layer of the first interconnect structure; and a first via electrically coupling the first conductive portion to the second conductive portion. In some embodiments, the inductor further includes a third conductive portion on the surface of the first interconnect structure; a second via electrically coupling the second conductive portion to the third conductive portion, the third conductive portion being part of the UBM layer. In some embodiments, the inductor further includes a ferrite core in a third layer of the first interconnect structure. In some embodiments, the third layer of the first interconnect structure being between at least: the first layer of the first interconnect structure and the second layer of the first interconnect structure, or the second layer of the first interconnect structure and the surface of the first interconnect structure. In some embodiments, the inductor includes a spiral inductor, a ring inductor or a solenoid. In some embodiments, the inductor is a ferrite core. In some embodiments, the inductor is below the first device. In some embodiments, the integrated circuit further includes a second interconnect structure on the front side of the first semiconductor wafer; and a third interconnect structure on a front side of the second semiconductor wafer. In some embodiments, the integrated circuit further includes a first bonding layer on the second interconnect structure; and a second bonding layer on the third interconnect structure, the first bonding layer being bonded to the second bonding layer.

Another aspect of this disclosure relates to a semiconductor device. The semiconductor device includes a first semiconductor wafer, a second semiconductor wafer, a first interconnect structure, an inductor, a through substrate via, and an under bump metallurgy (UBM) layer. The first semiconductor wafer has a first device in a front side of the first semiconductor wafer. The second semiconductor wafer has a second device in a front side of the second semiconductor wafer, the front side of the second semiconductor wafer is bonded to the front side of the first semiconductor wafer. The first interconnect structure is on a backside of the first semiconductor wafer. The inductor is on the backside of the first semiconductor wafer. The inductor includes a first portion within the first interconnect structure. The through substrate via extends through the first semiconductor wafer, and couples the inductor to at least the first device. The UBM layer is on a surface of the first interconnect structure. In some embodiments, the semiconductor device further includes a set of solder bumps on the UBM layer. In some embodiments, the first portion of the inductor includes a first conductive portion on a first layer of the first interconnect structure; a second conductive portion on a second layer of the first interconnect structure different from the first layer of the first interconnect structure; and a first set of vias electrically coupling the first conductive portion to the second conductive portion. In some embodiments, the inductor further includes a ferrite core in a third layer of the first interconnect structure, the third layer of the first interconnect structure being between the first layer of the first interconnect structure and the second layer of the first interconnect structure. In some embodiments, the inductor further includes a second portion having a third conductive portion on the surface of the first interconnect structure; a second set of vias electrically coupling the second conductive portion to the third conductive portion, the third conductive portion being part of the UBM layer. In some embodiments, the inductor further includes a ferrite core in a third layer of first interconnect structure, the third layer of the first interconnect structure being between the second layer of the first interconnect structure and the surface of the first interconnect structure. In some embodiments, the first semiconductor wafer has a thickness ranging from about 10 µm to about 200 µm. In some embodiments, the inductor is a spiral inductor, a ring inductor or a solenoid.

Still another aspect of this description relates to a method of forming an integrated circuit. The method includes bonding a front side of a first semiconductor wafer to a front side of a second semiconductor wafer, forming a through substrate via extending through the first semiconductor wafer, forming a first interconnect structure on a backside of the first semiconductor wafer, forming an under bump metallurgy (UBM) layer on a surface of the first interconnect structure, and forming a set of solder bumps on the UBM layer. In some embodiments, the front side of the first semiconductor wafer has a first device. In some embodiments, the forming the first interconnect structure includes forming a first portion of an inductor on the backside of the first semiconductor wafer. In some embodiments, the forming the UBM layer includes forming a second portion of the inductor on the backside of the first semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit, comprising:
a first semiconductor wafer having a first device in a front side of the first semiconductor wafer;
a second semiconductor wafer bonded to the first semiconductor wafer;

a first interconnect structure below a backside of the first semiconductor wafer;
an inductor below the first semiconductor wafer, and at least a portion of the inductor being within the first interconnect structure;
a second interconnect structure on the front side of the first semiconductor wafer; and
a through substrate via extending through the first semiconductor wafer, and the inductor being coupled to at least the first device by the second interconnect structure and the through substrate via.

2. The integrated circuit of claim 1, further comprising:
an under bump metallurgy (UBM) layer on a surface of the first interconnect structure.

3. The integrated circuit of claim 2, further comprising:
a set of solder bumps on the UBM layer.

4. The integrated circuit of claim 2, wherein the inductor comprises:
a first conductive portion on a first layer of the first interconnect structure;
a second conductive portion on a second layer of the first interconnect structure different from the first layer of the first interconnect structure;
a first via electrically coupling the first conductive portion to the second conductive portion;
a third conductive portion on the surface of the first interconnect structure; and
a second via electrically coupling the second conductive portion to the third conductive portion,
the third conductive portion being part of the UBM layer.

5. The integrated circuit of claim 4, wherein the inductor further comprises:
a ferrite core in a third layer of the first interconnect structure, the third layer of the first interconnect structure being between at least:
the first layer of the first interconnect structure and the second layer of the first interconnect structure, or
the second layer of the first interconnect structure and the surface of the first interconnect structure.

6. The integrated circuit of claim 1, wherein the inductor comprises:
a first conductive portion on a first layer of the first interconnect structure;
a second conductive portion on a second layer of the first interconnect structure different from the first layer of the first interconnect structure; and
a first via electrically coupling the first conductive portion to the second conductive portion.

7. The integrated circuit of claim 1, wherein the inductor comprises:
a spiral inductor, a ring inductor or a solenoid.

8. The integrated circuit of claim 7, wherein the inductor further comprises:
a ferrite core.

9. The integrated circuit of claim 1, wherein the inductor is below the first device.

10. The integrated circuit of claim 1, further comprising:
a third interconnect structure on a front side of the second semiconductor wafer.

11. The integrated circuit of claim 10, further comprising:
a first bonding layer on the second interconnect structure; and
a second bonding layer on the third interconnect structure, the first bonding layer being bonded to the second bonding layer.

12. A semiconductor device, comprising:
a first semiconductor wafer having a first device in a front side of the first semiconductor wafer;
a second semiconductor wafer having a second device in a front side of the second semiconductor wafer, the front side of the second semiconductor wafer is bonded to the front side of the first semiconductor wafer;
a first interconnect structure on a backside of the first semiconductor wafer;
an inductor on the backside of the first semiconductor wafer, the inductor comprising:
a first portion within the first interconnect structure;
a through substrate via extending through the first semiconductor wafer, and coupled to at least the inductor; and
an under bump metallurgy (UBM) layer on a surface of the first interconnect structure.

13. The semiconductor device of claim 12, wherein the first semiconductor wafer has a thickness ranging from about 10 micrometers (μm) to about 200 μm.

14. The semiconductor device of claim 13, further comprising:
a set of solder bumps on the UBM layer.

15. The semiconductor device of claim 13, wherein the first portion of the inductor comprises:
a first conductive portion on a first layer of the first interconnect structure;
a second conductive portion on a second layer of the first interconnect structure different from the first layer of the first interconnect structure; and
a first set of vias electrically coupling the first conductive portion to the second conductive portion.

16. The semiconductor device of claim 15, wherein the inductor further comprises:
a ferrite core in a third layer of the first interconnect structure, the third layer of the first interconnect structure being between the first layer of the first interconnect structure and the second layer of the first interconnect structure.

17. The semiconductor device of claim 15, wherein the inductor further comprises:
a second portion comprising:
a third conductive portion on the surface of the first interconnect structure;
a second set of vias electrically coupling the second conductive portion to the third conductive portion,
the third conductive portion being part of the UBM layer.

18. The semiconductor device of claim 17, wherein the inductor further comprises:
a ferrite core in a third layer of the first interconnect structure, the third layer of the first interconnect structure being between the second layer of the first interconnect structure and the surface of the first interconnect structure.

19. The semiconductor device of claim 13, wherein the inductor is a spiral inductor, a ring inductor or a solenoid.

20. A method of forming an integrated circuit, the method comprising:
bonding a front side of a first semiconductor wafer to a front side of a second semiconductor wafer, the front side of the first semiconductor wafer having a first device;
forming a through substrate via extending through the first semiconductor wafer;
forming a first interconnect structure on a backside of the first semiconductor wafer; wherein the forming the first interconnect structure comprises:

forming a first portion of an inductor on the backside of the first semiconductor wafer;
forming an under bump metallurgy (UBM) layer on a surface of the first interconnect structure, wherein the forming the UBM layer comprises:
forming a second portion of the inductor on the backside of the first semiconductor wafer; and
forming a set of solder bumps on the UBM layer.

* * * * *